United States Patent [19]
Hino et al.

[11] Patent Number: 5,374,469
[45] Date of Patent: Dec. 20, 1994

[54] FLEXIBLE PRINTED SUBSTRATE

[75] Inventors: Atsushi Hino; Amane Mochizuki; Kazuo Ouchi; Shoji Morita; Toshiki Naito; Kazumi Higashi; Masako Maeda; Masayuki Kaneto; Munekazu Tanaka; Masakazu Sugimoto, all of Osaka, Japan

[73] Assignee: Nitto Denko Corporation, Tokyo, Japan

[21] Appl. No.: 945,929

[22] Filed: Sep. 17, 1992

[30] Foreign Application Priority Data

| Sep. 19, 1991 | [JP] | Japan | 3-268872 |
| Nov. 26, 1991 | [JP] | Japan | 3-337556 |
| Nov. 26, 1991 | [JP] | Japan | 3-337557 |
| Mar. 23, 1992 | [JP] | Japan | 4-097232 |
| Mar. 23, 1992 | [JP] | Japan | 4-097233 |
| Apr. 1, 1992 | [JP] | Japan | 4-109285 |
| Apr. 14, 1992 | [JP] | Japan | 4-121167 |
| Apr. 16, 1992 | [JP] | Japan | 4-124174 |
| Apr. 21, 1992 | [JP] | Japan | 4-129538 |
| May 26, 1992 | [JP] | Japan | 4-160393 |
| Jun. 2, 1992 | [JP] | Japan | 4-174671 |
| Jun. 8, 1992 | [JP] | Japan | 4-174708 |

[51] Int. Cl.[5] .................................. B32B 9/00
[52] U.S. Cl. ........................ 428/209; 428/212; 428/473.5; 428/901
[58] Field of Search .............. 428/212, 901, 909, 195, 428/210, 413, 457, 473.5

[56] References Cited

U.S. PATENT DOCUMENTS

| 4,725,484 | 2/1988 | Kumagawa | 428/901 |
| 4,746,561 | 5/1988 | Kudinger et al. | 428/209 |
| 4,769,270 | 9/1988 | Nagamatsu et al. | 428/901 |
| 4,792,476 | 12/1988 | Numata et al. | 428/901 |
| 4,906,515 | 3/1990 | Inoguchi | 428/209 |
| 4,939,039 | 7/1990 | Watanabe | 428/901 |
| 4,946,734 | 8/1990 | Sugawara et al. | 428/209 |
| 4,963,425 | 10/1990 | Buchanan et al. | 428/210 |
| 4,985,293 | 1/1991 | Keep | 428/209 |
| 5,102,722 | 4/1992 | Iida et al. | 428/413 |

FOREIGN PATENT DOCUMENTS 1-287736 12/1986 Japan ........................ 428/901

OTHER PUBLICATIONS

Printed Circuits Handbook, Coombs ed., 1988 pp. 7.1-7.2.

Primary Examiner—Patrick J. Ryan
Assistant Examiner—Patrick R. Jewik
Attorney, Agent, or Firm—Sughrue, Mion, Zinn, Macpeak & Seas

[57] ABSTRACT

A flexible printed substrate imparted with an adhesive property for loading on an external substrate, a double printed substrate having formed on both surfaces thereof a metal layer or a wiring circuit, and a multilayer substrate having a multilayer structure are disclosed. The flexible printed substrate comprises an insulating resin layer comprising a low-linear expansion polyimide resin layer and a thermoplastic polyimide resin layer, and a metal layer or a wiring circuit formed on the low-linear expansion polyimide resin layer of the insulating resin layer, wherein a mixed region of the polyimide resin components is formed in the interface between the low-linear expansion polyimide resin layer and the thermoplastic polyimide resin layer.

46 Claims, 12 Drawing Sheets

FLEXIBLE PRINTED SUBSTRATE

FIELD OF THE INVENTION

The present invention relates to a flexible printed substrate imparted with an adhesive property for loading on an external substrate, a double printed substrate having formed on both surfaces thereof a metal layer or a wiring circuit, and a multilayer substrate having a multilayer structure.

BACKGROUND OF THE INVENTION

Recently, with the development of electronic industries and electric industries, a mounting method of printed substrates on instruments for public use and communication has been required to be simplified, miniaturized, and to have a high reliability, and also a flexible printed substrate which can be miniaturized and light-weighted and can make surface-loading has been required to have a high performance. As such a flexible printed substrate for meeting the requirement of such a high performance, a single sided substrate, a double sided substrate, or a multilayer substrate having a copper foil and an insulating resin film directly laminated thereon without using an adhesive has been marketed. Also, for attaining higher density printing and a higher performance, a demand for loading and mounting flexible printed substrates onto an external rigid substrate or a lead frame in a hybrid state has been increased.

However, at present, for loading a flexible printed substrate on an external substrate, a method of previously forming an adhesive layer on the external substrate side or a method of forming an adhesive layer on a flexible printed substrate has been employed.

In the former method, it is necessary to prepare an adhesive film having a shape coinciding with the adhesive region on an external substrate and also in the case of directly coating an external substrate with an adhesive, a precise coating technique is required. Thus, in any case, the above-described step is complicated.

On the other hand, in the latter method, it is necessary to form the adhesive layer on the printed substrate at the formation of the printed substrate, whereby in the case of using a conventionally used thermosetting adhesive comprising an epoxy series resin or a maleimide series resin, there is a possibility of lowering the adhesive characteristics by causing the deterioration of the resin by the contact with an acid or an alkali at a patterning step or a plating step of a wiring circuit. In particular, such a tendency is remarkable in the case of using the above-described thermosetting adhesive, which becomes a serious factor of lowering the reliability at loading and after loading the printed substrate.

On the other hand, as resins having higher heat resistance and chemical resistance than the above-described conventional adhesives, there are polyimide resins and it is disclosed in JP-A-61-22937 (the term "JP-A" as used herein means an "unexamined published Japanese patent application") that in these resins, a thermoplastic polyimide resin has an adhesive function. However, in the method described in the JP-A-61-22937, the thermoplastic polyimide resin layer is in direct contact with a copper foil and hence there are some problems in the point of chemical resistance at patterning a wiring circuit, etc., and also since the surface of a polyimide resin layer is usually inactive, in the case of laminating a thermosetting polyimide resin layer and a thermoplastic polyimide resin layer, the adhesive property is poor at the interface between the layers and hence a surface treatment is required for improving the adhesive power, which complicates the production step.

Also, recently, for obtaining high density printing and a high performance, the development and requirement for a double sided substrate from a single sided substrate have been increased and for meeting the requirement, double sided substrates having various structures have been proposed. As an example of such a double sided substrate, there is proposed a double sided substrate prepared by press-bonding under heating a copper foil onto both surfaces of a thermoplastic polyimide resin layer as an insulating resin substrate. However, since such a thermoplastic polyimide resin is inferior a little in heat resistance, chemical resistance, and dimensional stability to a conventionally used thermosetting polyimide resin, such a double sided substrate is insufficient for practical use.

Also, a linear expansion coefficient of a thermoplastic polyimide resin is generally from about 2 to 4 times the linear expansion coefficient of a copper foil and thus when a wiring circuit is patterned at the copper foils formed on both surfaces of the resin substrate, there is a possibility of causing curling of the substrate.

On the other hand, if a thermosetting polyimide resin layer is used in place of the thermoplastic polyimide resin, a double sided substrate or a multilayer substrate cannot be prepared without using an adhesive since the thermosetting polyimide resin does not have an adhesive function. Thus, the JP-A-61-22937 proposes a double sided substrate prepared by forming a thermoplastic polyimide resin layer on both surfaces of a thermosetting polyimide resin layer and press-bonding under heating a copper foil to the surface of each thermoplastic polyimide resin layer. However, since the double sided substrate has the problems as described above, such a substrate is not yet satisfactory.

Also, a method of adhering polyimide resin layers of two-layer substrates each comprising a copper foil and a thermosetting polyimide resin layer to each other through a thermoplastic polyimide resin layer may be considered but in such a case, a sufficient adhesion is not sometimes obtained at the interfaces of the both kinds of the resin layers as described above.

Furthermore, for electrically conducting metal layers or wiring circuits of the above-described double sided substrate or the multilayer substrate, through-holes are formed in the insulating resin layer (substrate) by a mechanical method using a drill, etc., a wet etching method using a chemical solution, or a chemical method using a photolithography by a photosensitive resin. Then, a complicated method of forming a thin metal layer (seed layer) on the inside wall of each through-hole thus formed by electroless plating or a vapor deposition, and further increasing the thickness of the thin metal layer by applying thereto elecrolytic plating to form a conducting path has been employed.

However, when the diameter of the through-hole is small, there is a possibility of causing an inferior formation of the thin metal layer on the inside wall of the through-hole and also the above-described production step becomes more complicated. In particular, it is not easy to visually confirm the thin film-form (layer-form) conducting path formed on the surface of the inside wall of the through-hole, and for confirming the formation of the conducting path, it is necessary to confirm it by contacting a probe for conducting path insepction with the land portions of the wiring circuits at both ends of the through-hole, and it is necessary to pay a close attention to the reliability of the electric conductivity.

Furthermore, in the formation of the through-hole, there is a limit on the fineness of the diameter of the through-hole in the case of using the drill or wet etching with a chemical solution, and thus the through-holes with a fine pitch are reluctant to form by the conventional techniques.

Also, in the case of using a photosensitive resin, a high aspect ratio is not obtained according to the kind of the resin composition employed and hence the material being used is limited. Also, in this case, the steps of a light exposure, a development, a pre-bake, an after-bake, etc., are required, which makes the formation step complicated.

In particular, if the diameter of the through-hole is too fine, a plating liquid being used for forming the conducting path does not sufficiently permeate into the through-hole, whereby not only a sure electrical conductivity is not obtained but also there are tendencies that the adhesion at the interface between the inside surface of the through-hole and the thin metal layer formed by plating is insufficient and also the electric resistance of the conducting path is increased.

Moreover, since the through-holes are formed after preparing the double sided substrate, the confirmation inspection of the preciseness of the formation of the through-holes is made in the latter half of the whole production steps, whereby the check of the formation of an inferior product is delayed, which is undesirable from the point of the production efficiency.

Also, in the case of using the above-described through-hole plating method, it is not so much expected to further improve the adhesive strength between the metal layers or wiring circuits formed on both surfaces of the substrate and the insulating resin layer, and according to the conditions of heating and press-adhesion at the preparation of the double sided substrate, it sometimes happens to cause peeling at the interfaces.

SUMMARY OF THE INVENTION

The present invention has been made to overcome the above-described problems in conventional flexible printed substrates, and in particular, double sided substrates and multilayer substrates.

An object of the present invention is to provide a flexible printed substrate comprising a polyimide resin layer and a metal layer such as a copper foil, etc., which is a single face printed substrate excellent in adhesion working to external substrates and an adhesion reliance or a double printed substrate or a multilayer printed substrate excellent in chemical resistance, curling resistance, an adhesive property with a metal layer, etc.

Another object of the present invention is to provide a flexible printed substrate having formed therein conducting paths for conducting the metal layers or wiring circuits in the double printed substrate or multilayer printed substrate.

A further object of the present invention is to provide a flexible printed substrate capable of easily forming precised wiring patterns and capable of reducing the thickness of the whole substrate.

Thus, as the result of various investigations for attaining the above objects, the inventors have discovered that the objects can be attained by a flexible printed substrate obtained using a thermoplastic polyimide resin showing an adhesive property by press-bonding under heating and further a low-linear expansion polyimide resin for imparting a curling resistance, and have succeeded in accomplishing the present invention.

That is, according to the first embodiment of the present invention, there is provided a flexible printed substrate comprising an insulating resin layer comprising a low-linear expansion polyimide resin layer and a thermoplastic polyimide layer and having formed on the low-linear expansion polyimide resin layer a metal layer or a wiring circuit, wherein a mixed region of the low-linear expansion polyimide resin component and the thermoplastic polyimide resin component is formed at the interface between both the polyimide resin layers.

According to the second embodiment of the present invention, there is provided a flexible double printed substrate comprising an insulating resin layer comprising a low-linear expansion polyimide resin layer, a thermoplastic polyimide resin layer, and a low-linear expansion polyimide resin layer in this order and having formed on each low-linear expansion polyimide resin layer a metal layer or a wiring circuit, wherein a mixed region of the low-expansion polyimide resin and the thermoplastic polyimide resin is formed at each interlayer of both the polyimide resin layers.

Furthermore, according to the third embodiment of the present invention, there is provided a multilayer printed substrate formed by laminating plural flexible printed substrates each being the flexible printed substrate of the first embodiment of the present invention.

Also, according to the fourth embodiment of the present invention, there is provided a flexible double printed substrate comprising an insulating resin layer comprising a thermoplastic polyimide resin layer and having formed on both surfaces of the insulating resin layer a metal layer or a wiring circuit, wherein the metal layers or wiring circuits are electrically connected by conducting paths formed by filling metallic material in through-holes formed in the thickness direction of the thermoplatic polyimide resin layer.

Furthermore, according to the fifth embodiment of the present invention, there is provided a flexible printed substrate comprising an insulating resin layer having embedded therein a wiring circuit.

Moreover, according to the sixth embodiment of the present invention, there is provided a flexible double printed substrate comprising a thermoplastic polyimide resin layer having a wiring circuit at both surfaces thereof embedded therein and low-linear expansion polyimide resin layers each formed on each surface of the thermoplastic polyimide resin layer adjacent thereto.

DETAILED DESCRIPTION OF THE INVENTION

Figure 1:
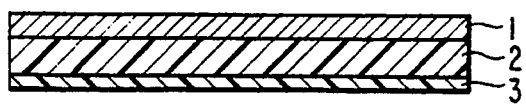
FIG. 1 is an enlarged schematic sectional view showing a flexible printed substrate of the present invention.

The flexible printed substrate of the first embodiment of the present invention has the structure shown in FIG. 1 of the accompanying drawings. That is, as shown in FIG. 1, an insulating resin layer substantially comprising polyimide resin layers only is formed by successively forming a low-linear expansion polyimide resin layer 2 and a thermoplatic polyimide resin layer 3 on one surface of a metal layer 1 such as a copper foil. Also, a mixed region of the low-linear expansion polyimide resin and the thermoplastic polyimide resin is formed in the interface between the low-linear expansion polyimide resin layer 2 and the thermoplastic polyimide resin layer 3. In addition, as a matter of course, the metal layer 1 in FIG. 1 may be etched into a wiring circuit having a desired pattern.

The low-linear expansion polyimide resin layer in the flexible printed substrate is formed by a polyimide resin having a linear expansion coefficient of $2.0 \times 10^{-5}$ cm/cm/° C. or less and functions to prevent the occurrences of the discrepancy of the circuit pattern by the thermal shrinkage of the flexible printed substrate obtained and curling and bending of the substrate at etching the copper foil.

On the other hand, the thermoplastic polyimide resin layer 3 formed at the other side of the low-linear expansion polyimide resin layer 2 is formed by a polyimide resin having a glass transition temperature of at least 200° C. and having a property that the melt viscosity at a temperature of higher than the glass transition temperature by 100° C. or at 390° C. is $1 \times 10^9$ poises or less and shows an adhesive property by pressing and heating.

For improving the coating operation of these polyimide resins and the adhesive property between the resin layers, it is preferred that each polyimide resin is coated as a solution of the polyimide precursor and then polyimide is formed by heating and dehydrocyclizing to form a polyimide resin layer.

There are no restrictions on the low-linear expansion polyimide resin and thermoplastic polyimide resin if they have the above-described properties but as the low-linear expansion polyimide resin, the polyimide resin obtained by polymerizing using at least one kind of 3,3',4,4'-biphenyltetracarboxylic acid dianhydride, pyromellitic acid dianhydride, bis(3,4-dicarboxyphenyl)-sulfone dianhydride, 2,2',3,3'-biphenyltetracarboxylic acid dianhydride, and 3,3',4,4'-benzophenyltetracarboxylic acid dianhydride as the tetracarboxylic acid component and at least one kind of p-phenylenediamine, 4,4'-diaminodiphenyl ether, m-phenylenediamine, 3,4'-diaminodiphenyl ether, 3,3'-diaminodiphenyl ether, and 4,4'-diaminobiphenyl as the diamine component is preferably used.

On the other hand, as the thermoplastic polyimide resin, a polyimide resin obtained by polymerizing using at least one kind of bis (3,4-dicarboxyphenyl ) ether dianhydride, bis(3,4-dicarboxyphenyl)sulfone dianhydride, bis(3,4-dicarboxyphenyl)hexafluoropropane dianhydride, 3,3',4,4'-benzophenonetetacarboxylic acid dianhydride, 2,2-bis(3,4-dicarboxyphenyl)propane dianhydride, and bis(3,4-dicarboxyphenyl)difluoromethane dianhydride as the tetracarboxylic acid component and at least one kind of [4-(3-aminophenoxy)phenyl]sulfone, bis[4-(4-aminophenoxy)phenyl]sulfone, bis[4-(4-aminophenoxy)phenyl]hexafluoropropane, 3,3'-diaminodiphenylsulfone, 3,4'-diaminodiphenylsulfone, 4,4'-diaminodiphenylsulfone, bis[4-(3-aminophenoxy)-phenyl]ether, bis[4-(4-aminophenoxy)phenyl]ether, bis[4-(3-aminophenoxy)phenyl]propane, bis[4-(4-aminophenoxy)phenyl]propane, 3,3'-diaminodiphenylpropane, 3,3'-diaminobenzophenone, 1,4-bis(4-aminophenoxy)benzene, 1,3-bis(4-aminophenoxy)benzene, and 4,4,'-bis(4-aminophenoxy)biphenyl as the diamine component is preferably used.

In addition, when a fluorinated thermoplastic polyimide resin obtained using the above-described tetracarboxylic acid component and diamine component at least one of which containing a fluorine atom is used as the thermoplastic polyimide resin, the dielectric constant of the substrate can be lowered and hence the use of such a polyimide resin is particularly useful for a computer requiring a high signal transmission speed.

For the preparation of each of the polyimide resins, almost equimolar amounts of the components described above (the tetracarboxylic acid component and the diamine component) are dissolved together in an organic solvent such as N-methyl-2-pyrrolidone, N,N'-dimethylacetamide, N,N'-dimethylformamide, 1,3-dimethyl-2-imidazolidinone, dimethylsulfoxide, dimethylsulfide, dimethylsulfone, pyridine, tetramethylurea, diethylene glycol dimethyl ether, triethylene glycol dimethyl ether, etc., to form a solution of each polyimide precursor and each polyimide is formed by dehydrocyclizing each precursor solution by heating.

The flexible printed substrate according to the first embodiment of the present invention can be practically obtained by the following method.

First, the solution of the low-linear expansion polyimide precursor prepared as described above is coated on a metal layer such as a copper foil using a roll coater, a comma coater, a knife coater, a doctor blade, etc., and dried. In this case, it is preferable that drying in this step is carried out under the drying condition of only removing the organic solvent and not forming imide by dehydrocyclization, for example, at a temperature of from about 60° to 180° C. such that a low-linear expansion polyimide precursor layer is formed.

Then, the thermoplastic polyimide precursor solution is coated on the surface of the low-linear expansion polyimide precursor layer formed as described above and dried to form a flexible printed substrate having the structure of metal layer/low-linear expansion polyimide precursor layer/thermoplastic polyimide precursor layer. In addition, in this case, it is preferable to carry out drying under the drying condition such that the organic solvent only is removed and the imide formation of the polyimide precursors does not occur by dehydrocyclization. By coating the thermoplastic polyimide precursor solution on the layer of the low-linear expansion polyimide precursor as described above, the surface portion of the previously coated and dried low-linear expansion polyimide precursor layer is dissolved with the organic solvent of the latter solution, whereby a mixed region of the polyimide precursor components is formed at the interface of the layers, and when both the precursors of the layers are converted into the polyimides by heating, a sufficient interface adhesion is obtained.

Then, by heating the flexible printed substrate having the structure of metal layer/low-linear expansion polyimide precursor layer/thermoplastic polyimide precursor layer obtained as described above to a temperature of at least 400° C. in, preferably, an inert gas atmosphere, the flexible printed substrate of the present invention is obtained.

In this case, as a heating means, a hot blast circulation type heating furnace, a far infrared heating furnace, etc., can be used.

If the heating temperature is lower than 400° C., the formation of polyimide does not sufficiently proceed, whereby it sometimes happens that the characteristics specific to a polyimide cannot be sufficiently obtained. Also, if oxygen exists at the formation of the polyimides, not only the surface of the metal layer is oxidized but also there is a possibility that the thermoplastic polyimide resin causes a thermal decomposition and hence heating is preferably carried out in the atmosphere of an inert gas such as a nitrogen gas, etc., or in vacuo. Usually the oxygen concentration at the formation of polyimide by heating is 4% or less, and preferably 2% or less.

In addition, if necessary, the metal layer may be patterned into a desired circuit pattern by etching to form a wiring circuit.

Since in the flexible printed substrate of the first embodiment of the present invention obtained as described above, the thermoplastic imide resin layer has an adhesive property, the flexible substrate can be simply loaded and mounted by placing the flexible printed substrate on the adhering region of an external substrate with positioning control and press-adhering thereto by heating at a temperature of from about 30° to 150° C. higher than the glass transition temperature of the thermoplastic polyimide resin by applying a pressure of from 1 to 500 kg/cm² using a laminate roll or a hot press.

Figure 2:
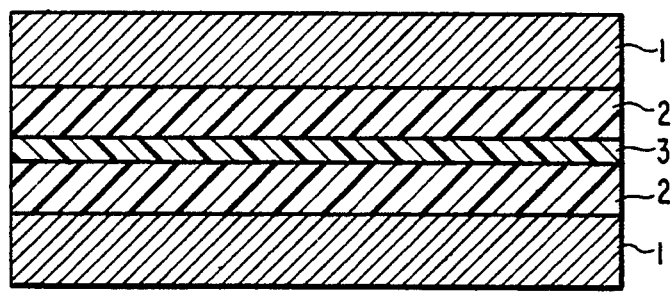
FIG. 2 is an enlarged schematic sectional view showing a double sided substrate of the present invention.

Also, the flexible printed substrate of the second embodiment of the present invention is a double printed substrate and has the structure shown in FIG. 2. That is, a base material substantially comprising polyimide resin layers comprising low-linear expansion polyimide resin layer 2/thermoplastic polyimide resin layer 3/low-linear expansion polyimide resin layer 2 is used as insulating resin layers, and metal layer 1 or a wiring circuit is formed on each of the surfaces of both the low-linear expansion polyimide resin layers 2,2. In this case, a mixed region of both the resin components is formed at each interface of the low-linear expansion polyimide resin layer 2 and the thermoplastic polyimide resin layer 3 as the flexible printed substrate of the first embodiment of the present invention.

Also, if the linear expansion coefficient of the thermoplastic polyimide resin layer in the flexible double printed substrate is $a_1$, the thickness of the thermoplastic polyimide resin layer is $t_1$, the linear expansion coefficient of the low-expansion polyimide resin layer is $a_2$, and the total thickness of the two low-linear expansion polyimide resin layers is $t_2$, it is preferable to set the difference between the value of $a_1 \cdot [t_1/(t_1+t_2)] + a_2 \cdot [t_2/(t_1+t_2)]$ and the linear expansion coefficient of the wiring circuit to a value of smaller than $1.0 \times 10^{-5}$ cm/cm/°C. since in this case, the occurrences of the discrepancy of the circuit pattern by thermal shrinkage and curling after etching can be prevented.

Furthermore, by employing a thermoplastic polyimide resin layer having a linear expansion coefficient of $4.0 \times 10^{-5}$ cm/cm/°C. or less and controlling the linear expansion coefficient of the total insulating resin layers including the low-linear expansion polyimide resin layers to $2.6 \times 10^{-5}$ cm/cm/°C. or less, the curling resistance can be further improved.

The flexible double printed substrate of the second embodiment of the present invention can be obtained by preparing two flexible printed substrates shown in FIG. 1, combining the two substrates such that the thermoplastic polyimide resin layers are in contact with each other, and press-adhering them by heating.

Figure 3A:
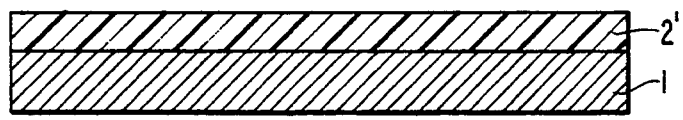
FIG. 3 is enlarged schematic sectional views of the steps explaining a method of obtaining the multilayer substrate of the present invention.
Figure 3B:
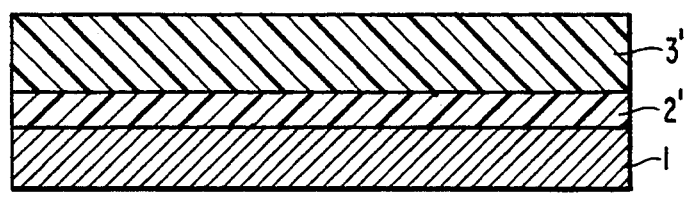
Figure 3C:
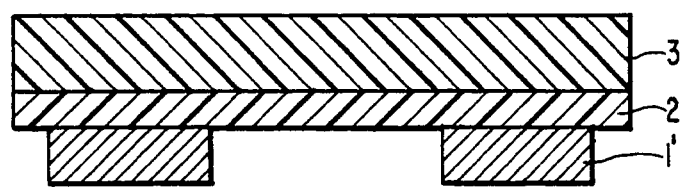
Figure 3D:
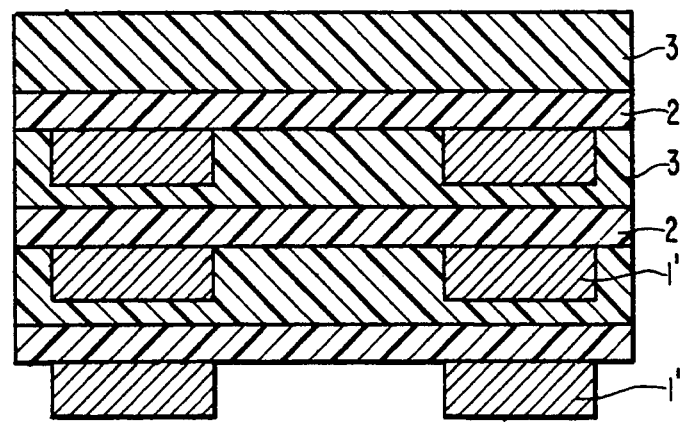

The flexible printed substrate of the third embodiment of the present invention is a multilayer substrate and has the structure shown in FIG. 3(d). That is, the multilayer substrate is produced by the production steps shown in FIG. 3(a) to (d) utilizing the adhesive property of the thermoplastic polyimide resin layer 3 of the flexible printed substrate of the first embodiment of the present invention shown in FIG. 1.

Thus, on one surface of a metal layer 1 such as a copper foil is coated a low-linear expansion polyimide precursor solution 2' and dried [FIG. 3(a)] and further a thermoplastic polyimide precursor solution 3' is coated thereon and dried [FIG. 3(b)]. The assembly is heated to a temperature of at least 400° C. in an inert gas atmosphere to convert the precursors in the layers 2' and 3' into polyimides and after patterning the metal layer 1 to form a wiring circuit 1' [FIG. 3(c)], a plurality of such flexible printed substrates are laminated such that the thermoplastic polyimide resin layer of each substrate is in contact with the wiring circuit 1' of other substrate thus formed followed by press-adhering them by heating to provide the flexible printed substrate [FIG. 3(d)] of multilayer structure [FIG. 3(d)].

Figure 4:
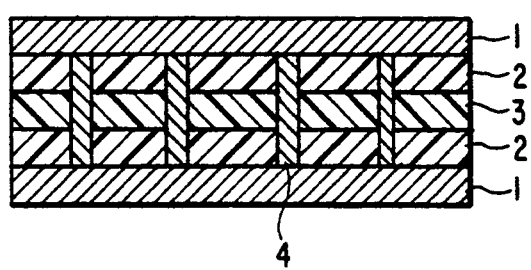
FIG. 4 is an enlarged schematic sectional view showing other embodiment of a double printed substrate of the present invention.

In the flexible double printed substrate and the multilayer flexible substrate of the present invention described above, the metal layers 1,1 or the wiring circuits 1', 1' are electrically connected with conducting paths 4 formed by filling a metallic material in through-holes formed in the insulating resin layers in the thickness direction thereof. A practical structure of the flexible double printed substrate is shown in FIG. 4. The substrate having such a structure is obtained by, e.g., the method shown in FIG. 5(a) to (e) or FIG. 6(a) to (e).

Figure 5A:
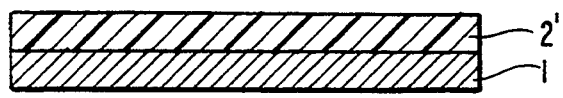
FIG. 5 is enlarged schematic sectional views of the steps explaining a method of producing the double printed substrate shown in FIG. 4.
Figure 5B:
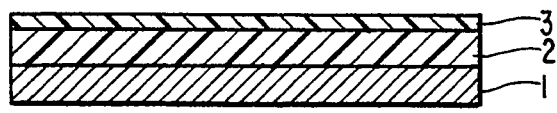

That is, as shown in FIG. 5(a), on one surface of a metal layer 1 such as a copper foil is coated a low-linear expansion polyimide precursor solution 2' followed by drying and then a thermoplastic polyimide precursor solution 3' is coated thereon and dried. Furthermore, the assembly is dried in heating furnace to convert the precursors in the layers 2' and 3' into polyimides to provide the structure shown in FIG. 5(b). This is the same as the flexible printed substrate shown in FIG. 1.

Figure 5C:
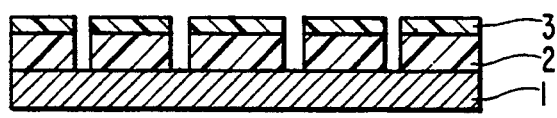

Then, as shown in FIG. 5(c), through-holes are formed in the predetermined positions (region of forming conducting paths 4) of the insulating resin layers comprising the low-linear expansion polyimide resin layer and the thermoplastic polyimide resin layer 3.

Figure 5D:
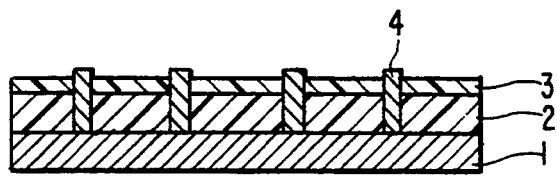

Metallic material is filled in each through-hole thus formed by elecrolytic plating to form each conducting paths 4 and further as shown in FIG. 5(d), metallic material is projected as bump-form from the surface of the thermoplastic polyimide resin layer 3 to form a 1st single faced substrate.

Figure 5E:
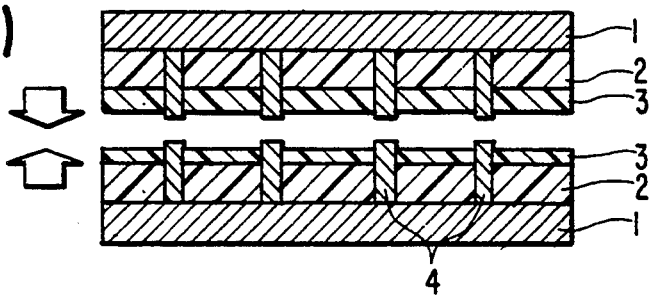
Figure 6A:
FIG. 6 is enlarged schematic sectional views of the steps explaining other method of producing a double printed substrate of the present invention.
Figure 6B:
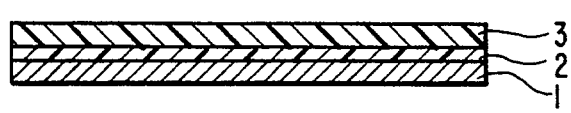
Figure 6C:
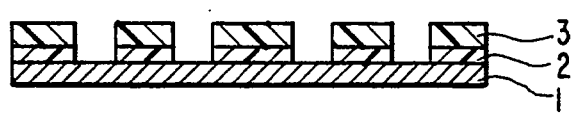
Figure 6D:
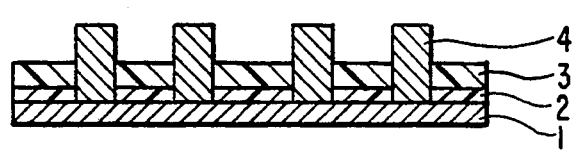
Figure 6E:
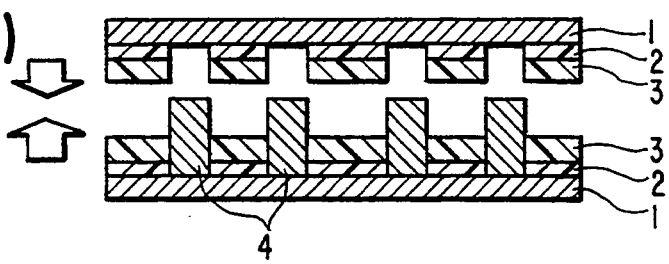

On the other hand, a 2nd single sided substrate having through-holes having almost the same size as those of the 1st single sided substrate with the same intervals as those of the 1st substrate is prepared and a metallic material is filled in the through-holes as described above. Then, as shown in FIG. 5(e), the 2nd single faced substrate is placed on the 1st single sided substrate with positioning control such that the positions of the through-hole-formed portions (conducting paths 4) of the 2nd single faced substrate coincide with those of the 1st single faced substrate and they are bonded to each other by the adhesive power of each thermoplastic polyimide resin layer 3 by heat-pressing them to provide the flexible double printed substrate of the present invention having conducting paths.

Also, as other method, as shown in FIG. 6(a) to (e), the flexible double printed substrate of the present invention can be also obtained by forming through-holes only without filling a metallic material in the 2nd single faced substrate and bonding the 2nd single faced substrate to the 1st single faced substrate such that the projections composed of a metallic material of the 1st single faced substrate are inserted into the through-holes of the 2nd single faced substrate.

The diameter of the through-holes formed as described above may be optionally selected according to the use of the flexible printed substrate and the size of the wiring circuit but is usually from about 1 to 200 μm, and preferably from about 10 to 100 μm.

For forming the through-holes, there are a wet etching method with an aqueous alkali solution, a dry etching method by laser or plasma, and a mechanical hole-making method by punching or a drill but, from the view points of the processing preciseness, the processing speed, the diversity of the processing forms, etc., laser processing is preferred, and in particular, the abrasion with ultraviolet laser having the center of the oscillation wavelength of 400 nm or less is preferable. As such a ultraviolet laser, there is the 3rd higher harmonics of YAG laser or excimer laser.

As the metallic material for forming conducting paths by filling the through-holes by electrolytic plating, there are metals such as gold, silver, copper, nickel, cobalt, soft solder, chromium, tungsten, rhodium, tin, lead, indium, platinum, etc., and various alloys mainly composed of these metals. Also, projecting the metallic material of the conducting path from the thermoplastic polyimide resin layer can be easily made by controlling the plating time. The height of the projection can be optionally selected according to the thickness of the insulating resin layer but is preferably from about 1 to 200 μm from the points of the positioning control in the case of forming the double printed substrate by bonding two single faced substrates in the subsequent step and forming the sure conducting paths.

It is preferable that two single faced substrates are bonded to each other at a temperature of from about 30° to 150° C. higher than the glass transition temperature of the thermoplastic polyimide resin by applying a pressure of from about 5 to 500 kg/cm$^2$ in an inert gas atmosphere using a laminate roll or a hot press.

Figure 9:
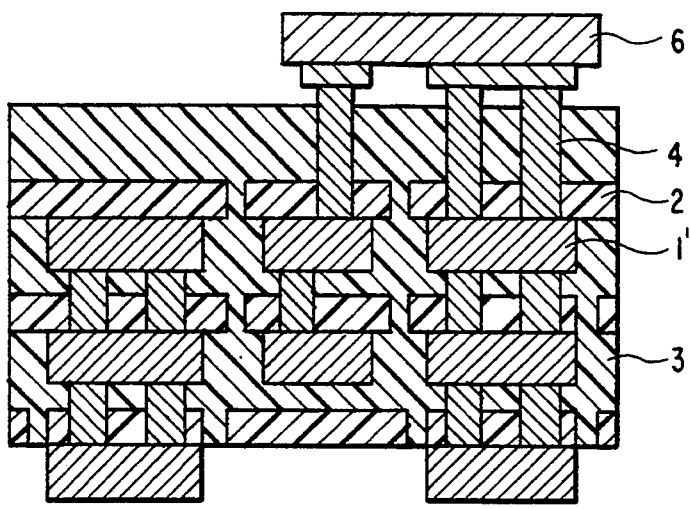
FIG. 9 is an enlarged schematic sectional view showing the state that a semiconductor element is connected to the multilayer substrate shown in FIG. 8 through a bump electrode.
Figure 10:
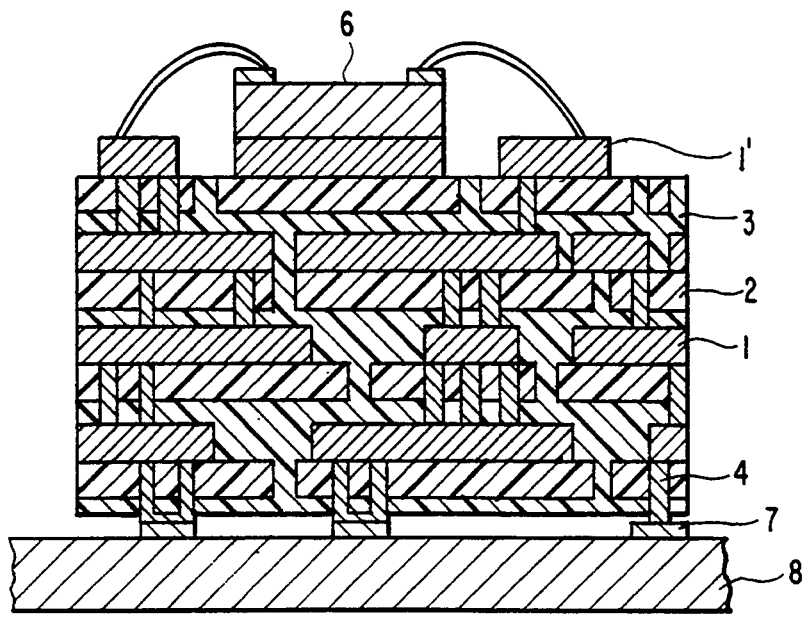
FIG. 10 is an enlarged schematic sectional view showing the state that a multilayer substrate of the present invention having loaded thereon a semiconductor element is mounted on an external substrate.

The conducting paths can be formed in a multilayer flexible substrate. The formation method is shown in FIG. 7(a) to (d) and a modified method thereof and the using method are shown in FIG. 8 to FIG. 10.

Figure 7A:
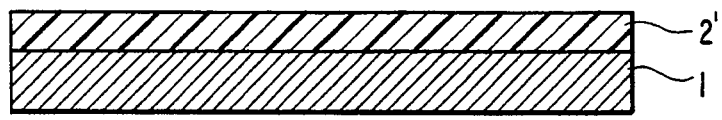
FIG. 7 is enlarged schematic sectional views of the steps explaining a method of producing a multilayer substrate of the present invention.
Figure 7B:
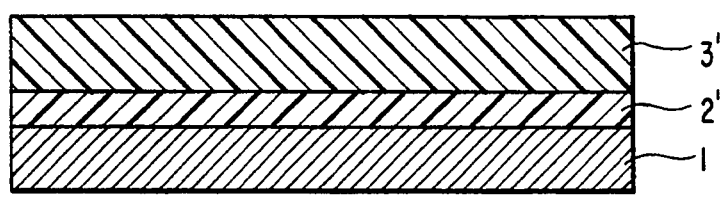
Figure 7C:
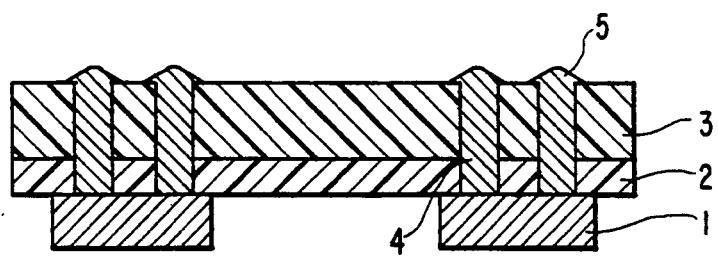

The method shown in FIG. 7(a) to (c) is fundamentally same as the method of FIG. 6. In addition, since a multilayer substrate is formed by laminating a plurality of single faced substrates, it is necessary that each metal layer 1 is processed into a wiring circuit of a desired form by a conventional etching method, etc.

Figure 7D:
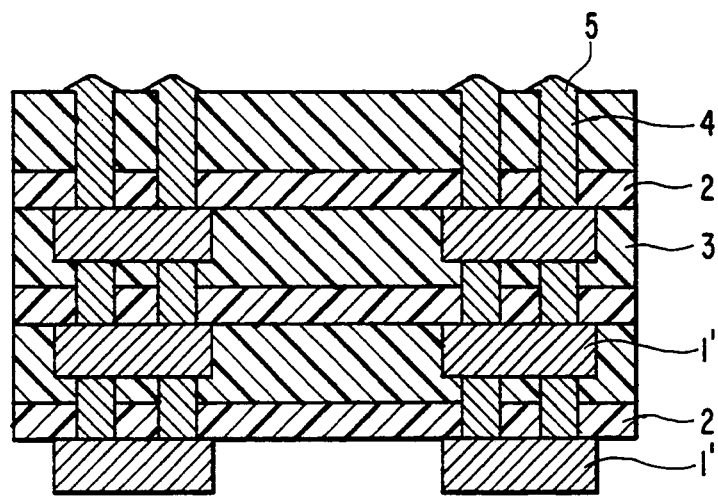

A plurality of flexible single printed substrates each obtained as shown in FIG. 7(c) are laminated as shown in FIG. 7(d) and the multilayer flexible printed substrate of the present invention having conducting paths 4 can be obtained by press-bonding them to each other under heating.

Figure 8:
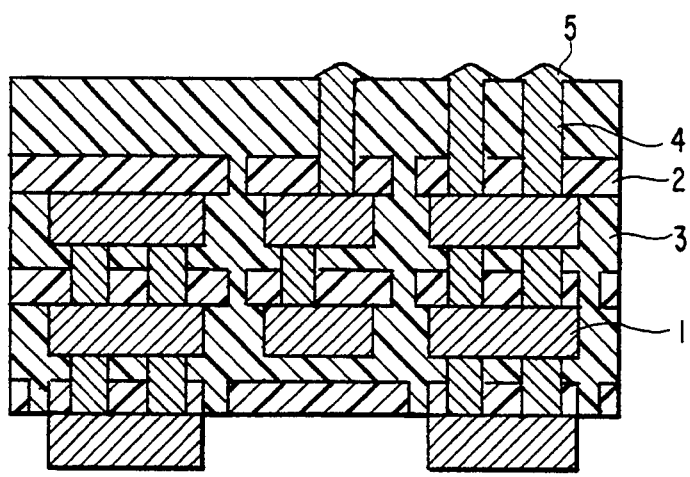
FIG. 8 is an enlarged schematic sectional view showing other embodiment of a multilayer substrate of the present invention.

FIG. 8 is an enlarged schematic sectional view of other embodiment of the multilayer flexible printed substrate of the present invention. In the substrate shown in FIG. 8, through-holes are formed not only in the regions of forming wiring circuits 1' but also in other regions near the wiring circuit regions and a metallic material is not filled in the through-holes in the latter regions. When a plurality of flexible printed substrates are laminated in a multilayer structure, the through-holes which do not contain a metallic material are filled with the fused flowing portion of the thermoplastic polyimide resin layer 3 to give an anchoring effect, whereby the adhesive strength of the substrates is improved.

FIG. 9 is an enlarged schematic sectional view showing the state of connecting a semiconductor element 6 to the multilayer flexible printed substrate shown in FIG. 8 through bump elecrodes.

FIG. 10 is an enlarged schematic sectional view showing the state that a semiconductor element 6 is loaded on the multilayer flexible printed substrate of the present invention and after bonding them by wires, the multilayer flexible printed substrate is connected to an external circuit 7 of an external substrate 8 with bump-form metallic projections 5. In the present invention, the bump-form metallic projections 5 each is not necessary to be formed for each through-hole as shown in FIG. 7 to FIG. 9, and they can be formed by simultaneously closing a plurality of through-holes as shown in FIG. 10.

In the flexible printed substrate of the fourth embodiment of the present invention, an insulating resin layer comprises a thermoplastic polyimide resin layer 3 having on both surfaces thereof a metal layer 1 or a wiring circuit 1', and the metal layers 1 or the wiring circuits 1' formed on the front and back surfaces of the thermoplastic polyimide resin layer 3 are electrically connected by conducting paths 4 formed by filling a metallic material in through-holes formed in the thickness direction of the thermoplastic polyimide resin layer 3. The flexible printed substrate practically has the structure shown in FIG. 11.

Figure 11:
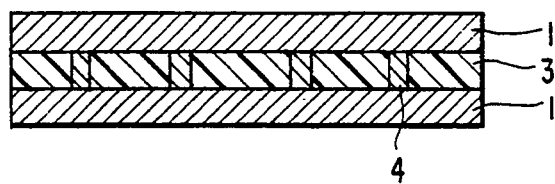
FIG. 11 is an enlarged schematic sectional view showing a practical example of the double printed substrate of the present invention.

That is, the flexible printed substrate shown in FIG. 11 has the structure of lacking the low-linear expansion polyimide resin layer in the flexible double printed substrate shown in FIG. 4 described above. The double printed substrate wherein the insulating resin layer comprises the thermoplastic polyimide resin layer 3 is slightly inferior in heat resistance, chemical resistance, and dimensional stability but can be used according to a use. Since the conducting paths 4 are formed by filling a metallic material in the through-holes without being formed by a conventional through-hole plating, the electric resisance of the conducting path 4 can be reduced and the electric conductivity is surely obtained.

Figure 12:
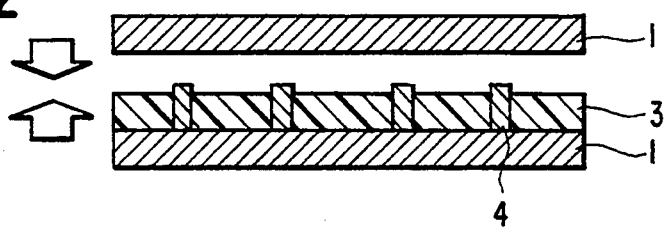
FIG. 12 is an enlarged schematic sectional view showing a 1st production method of the double printed substrate shown in FIG. 11.
Figure 13:
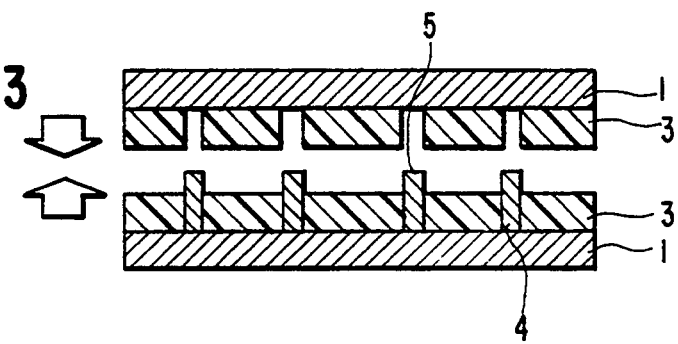
FIG. 13 is an enlarged schematic sectional view showing a 2nd production method of the double printed substrate shown in FIG. 11.
Figure 14:
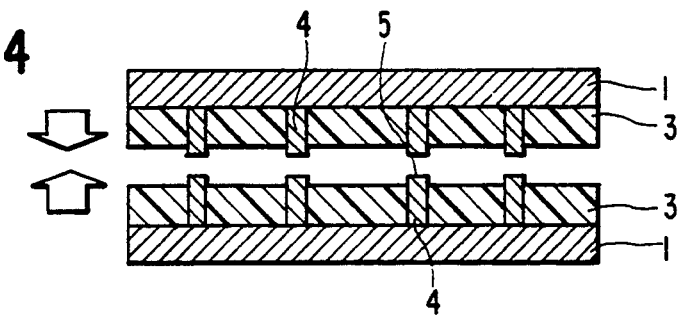
FIG. 14 is an enlarged schematic sectional view showing a 3rd production method of the double printed substrate shown in FIG. 11.

Such a flexible double printed substrate can be obtained by the method shown in, for example, FIG. 12, FIG. 13, or FIG. 14.

That is, in the method shown in FIG. 12, through-holes are formed as described above in a thermoplastic polyimide resin layer 3 formed on a metal layer 1, and metallic material is filled in the through-holes by electrolytic plating to form conducting paths 4. Furthermore, the metallic material is projected from the surface of the thermoplastic polyimide resin layer 3 to provide a single faced substrate. The flexible double printed substrate can be prepared by press-bonding to the metallic material projected side of the single faced substrate to a metal layer 1 such as a copper foil, etc.

In another method, as shown in FIG. 13, a single faced substrate having metallic material projections 5 formed by filling a metallic material in through-holes 4 is press-bonded to a single faced substrate having through-holes without being filled with a metallic material with positioning control such that the through-hole formed portions of both single faced substrates face each other. This method is fundamentally the same as the method shown in FIG. 6.

Furthermore, in another method, as shown in FIG. 14, two single faced substrates each having metallic material projections 5 formed by filling a metallic material in through-holes are prepared and these substrates are press-bonded to each other with positioning control such that the metal projections 5 of the substrates face each other. This method is fundamentally the same as the method shown in FIG. 5.

For more ensuring the electric contact between metal layers 1 or wiring circuits 1' of both substrates with conducting paths 4 in the case of forming the conducting paths 4 in the flexible double printed substrate or multilayer flexible substrate to improve the adhesive strength at the interface between the metal layer 1 and the insulating resin layer, it is preferred to embed bump-form metallic material projections 5 each formed at at least one end of each conducting path 4 in the metal layer 1 or the wiring circuit 1'. This case is the structure as shown in FIG. 15 or FIG. 16.

Figure 15:
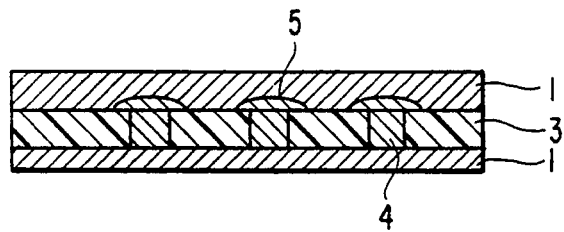
FIG. 15 is an enlarged schematic sectional view showing other example of the double printed substrate of the present invention.

The substrate having the structure shown in FIG. 15 is obtained as follows. After forming an insulating resin layer such as a thermoplastic polyimide resin layer 3, etc., on a metal layer 1, through-holes 4 are formed in the insulating resin layers only and a metallic material is filled in the through-holes thus formed using the metal plate 1 as a cathode to form metal projections 5. Then, electroless plating is applied to the side of the metal projections 5 to form a metal layer and, if necessary, elecrolytic plating is applied. Thus, the substrate having the structure shown in FIG. 15 can be obtained.

Figure 16:
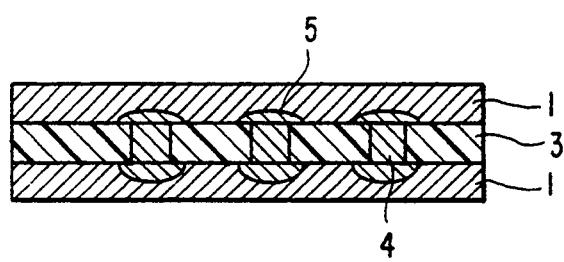
FIG. 16 is an enlarged schematic sectional view showing still other example of the double printed substrate of the present invention.

The substrate having the structure shown in FIG. 16 is obtained as follows. After forming through-holes 4 in an insulating resin layer 3 only, the surface of a metal layer 1 exposing to the bottom portions of the through-holes is ground in a hemispherical form with a solution of chemical abrasives and a metallic material is filled in the ground portions, the through-holes by plating using the metal layer 1 as a cathode, and further metal projections 5 are formed. Then, a metal layer 1 such as a copper foil, etc., is press-bonded to the metal projections 5 or electroless plating and electrolytic plating are applied thereto as in the case of FIG. 15. Thus, the substrate having the structure shown in FIG. 16 can be obtained.

In addition, the insulating resin layer may be substantially composed of a polyimide resin layer, and may be formed by a thermoplastic polyimide resin layer only, may be composed of a mixture of a thermoplastic polyimide resin and a low-linear expansion polyimide resin in a layer form, or may be a laminate layer structure of a low-expansion polyimide resin layer and a thermoplastic polyimide resin layer.

The flexible printed substrate of the fifth embodiment of the present invention is a flexible printed substrate wherein a wiring circuit 1' is embedded in an insulating resin layer. That is, by employing such a structure, the thickness of the flexible printed substrate finally obtained depends upon the thickness only of the insulating resin layer, whereby the whole thickness of the substrate can be thinned.

As the production method of the flexible printed substrate having the above strucure, there is, for example, a method shown in FIG. 17.

Figure 17A:
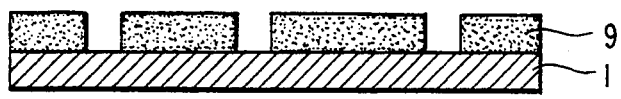
FIG. 17 is enlarged schematic sectional views of the steps explaining a method of producing the flexible printed substrate of the present invention having a wiring circuit embedded therein.

As shown in FIG. 17(a), a photoresist 9 is formed on a metal layer 1 such as a copper foil, a copper plate, etc., and a desired circuit pattern is formed. Since the metal layer 1 is removed in the final step shown in FIG. 17(e), there is no particular restriction on the metal layer if the metal layer can be selectively removed at the step. Also, the photoresist 9 can be determined according to the thickness, width, and pitch of the desired wiring circuit 1' and the kind of the photoresist being used may be of a negative type or of a positive type.

Figure 17B:
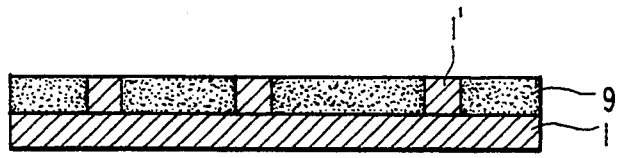

As shown in FIG. 17(b), an electrically conductive metal such as gold, silver, copper, nickel, cobalt, etc., or an alloy mainly composed of those metals is filled in the circuit pattern thus formed by electrolytic plating or electroless plating to form a wiring circuit 1'. The kind of a metal being filled may be a single kind or laminated layers of different metals. In addition, since the metal layer 1 is removed by etching in the final step, it is necessary that the kind of the metal of the wiring circuit 1' at the interface portion of contacting with the metal layer 1 is different from the kind of the metal of the metal layer 1. The wiring circuit 1' can have a multilayer structure using plural kinds of metals for preventing the diffusion of the metal of the wiring circuit 1' into an insulating resin layer 3 at laminating the insulating resin layer 3 in the subsequent step and for improving the adhesive property of the wiring circuit 1'.

There is no particular restriction on the thickness of such a wiring circuit 1' but since the wiring circuit 1' is embedded in the insulating resin layer 3 in the subsequent step, it is preferable that the thickness is 1 μm or more from the points of the adhesive property and the falling prevention.

Figure 17C:
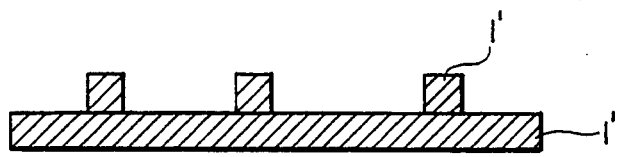
Figure 17D:
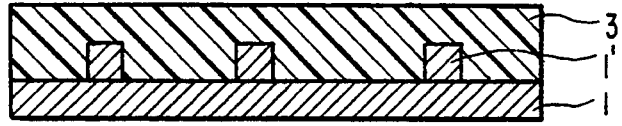

After forming the wiring circuit 1' described above, the photoresist 9 is removed as shown in FIG. 17(c) and further as shown in FIG. 17(d), the surface of the exposed wiring circuit 1' is covered with an insulating resin layer 3 to embed the wiring circuit 1'. As the insulating resin in this case, a polyimide resin is preferably used in the points of the heat resistance, chemical resistance, dimensional stability, etc., and also the use of a low-linear expansion polyimide resin is particularly preferable.

Figure 17E:
Figure 17F:
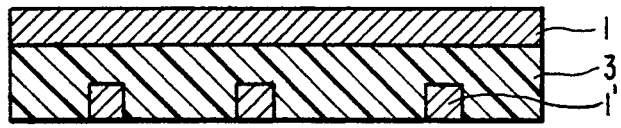
Figure 17G:
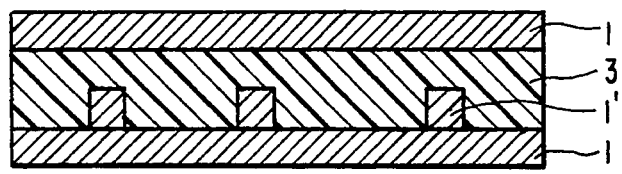
Figure 17H:
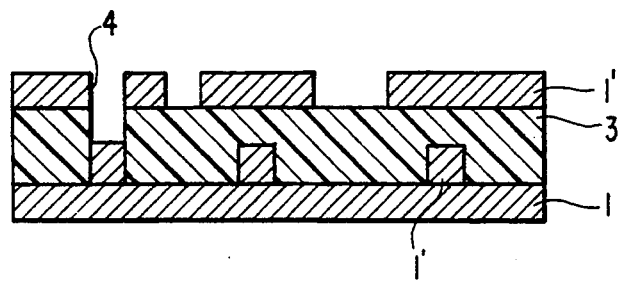

After covering the wiring circuit 1' with the insulating resin, the metal layer is removed by a means of etching, etc., in the final step as shown in FIG. 17(e) to provide the flexible printed substrate of the present invention. A metal layer 1 may be laminated on the opposite surface of the flexible printed substrate thus obtained to circuit embedded side to provide a double printed substrate as shown in FIG. 17(f).

The double printed substrate can be also obtained by previously forming a metal layer 1, as shown in FIG. 17(d'), to the back surface of the insulating resin layer 3 laminated as shown in FIG. 17(d) described above.

As shown in FIG. 17(d"), a wiring circuit is formed in place of the metal layer 1 and by forming, if necessary, conducting paths 4 in the insulating resin layer 3 by through-hole plating, etc., the wiring circuits at both surfaces of the resin layer can be electrically conducted.

FIG. 18 is enlarged schematic sectional views showing other embodiment of the production step of a flexible printed substrate wherein the wiring circuit 1' is embedded in the resin layer, and metal projections 5 for connecting to terminals of the wiring circuit 1' are formed.

Figure 18A:
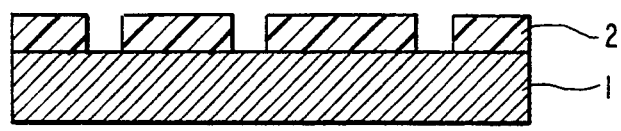
FIG. 18 is enlarged schematic sectional views of the steps explaining other method of producing the flexible printed substrate of the present invention having a wiring circuit embedded therein.
Figure 18B:
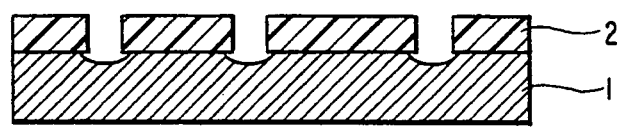
Figure 18C:
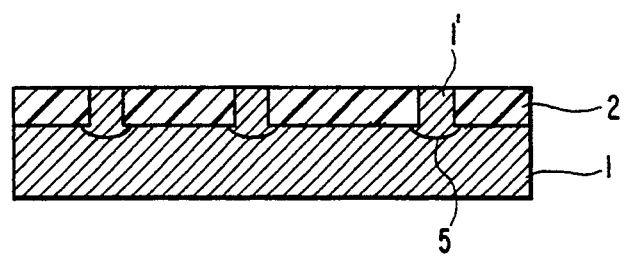
Figure 18D:
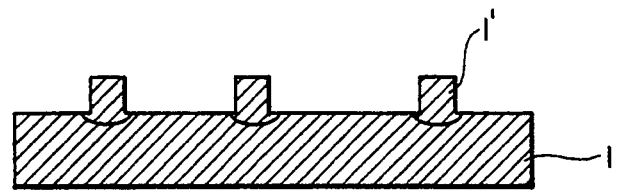
Figure 18E:
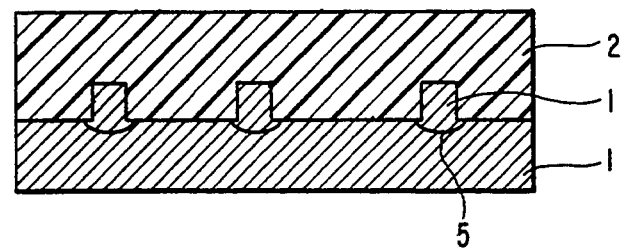
Figure 18F:
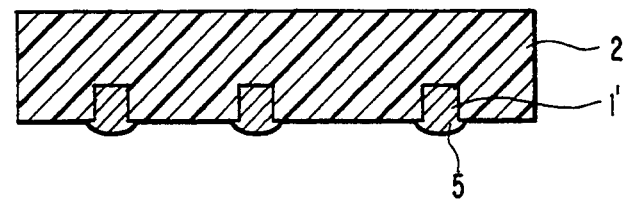

Chemical etching or an electrolytic corrosion is applied to the surface of a metal layer 1 formed at the bottom of a circuit pattern 2 as shown in FIG. 18(a) to form concaved portions as shown in FIG. 18(b) and thereafter, by carrying out the steps as shown in FIG. 17, a flexible printed substrate having metal projections 5 for connection can be obtained.

FIG. 19 is enlarged schematic sectional views showing the steps of producing a flexible printed substrate having metal projections 5 for connection formed at the opposite side of an insulating resin layer to the embedded side of a wiring circuit 1'.

Figure 19A:
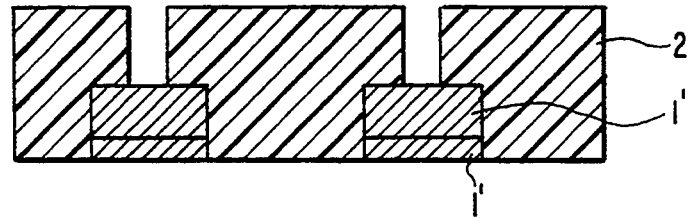
FIG. 19 is enlarged schematic sectional views of the steps explaining a method of producing a flexible printed substrate of the present invention having metal projections connected to a wiring circuit embedded therein.
Figure 19B:
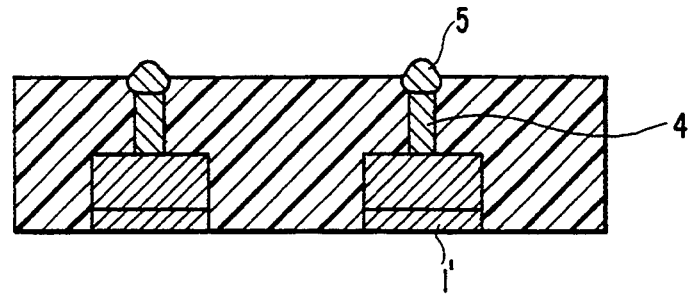

As shown in FIG. 19(a), holes or grooves reaching a wiring circuit 1' embedded in an insulating resin layer 2 are formed by a means of wet etching or dry etching and as shown in FIG. 19(b), a metal is filled in the holes or the grooves on the exposed wiring circuit by electrolytic etching and further metal projections 5 are formed as shown in FIG. 19(b). In addition, FIG. 19 shows an embodiment that the wiring circuit 1' is formed by laminated layers of two kinds of metals and the metal projections 5 are also formed by laminated layers of two kinds of metals.

The flexible printed substrate of the sixth embodiment of the present invention is a flexible double printed substrate wherein each wiring circuit 1' is embedded in both sides of a thermoplastic polyimide resin layer 3 as an insulating layer and further, each low-linear expansion polyimide resin layer is formed on both sides of the thermoplastic polyimide resin layer 3. That is, by employing such a structure, the thickness of the flexible double printed substrate finally obtained depends on the thickness only of the insulating resin layer, whereby the whole thickness thereof can be decreased, and further since a low-linear expansion polyimide resin layer 2 as a cover film of the wiring circuit 1' is formed in a body, the occurrence of short-circuit by the contact with external matters can be prevented to improve the electric reliance.

A practical example of such a flexible double printed substrate has the structure shown in FIG. 20.

Figure 20A:
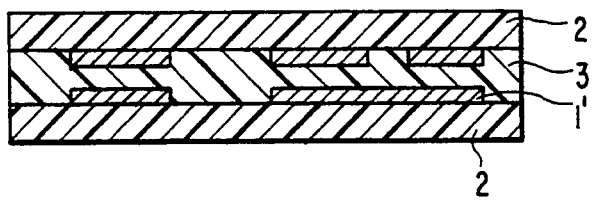
FIG. 20 (a) to (d) are enlarged schematic sectional views of various examples of the flexible double printed substrate of the present invention.
Figure 20B:
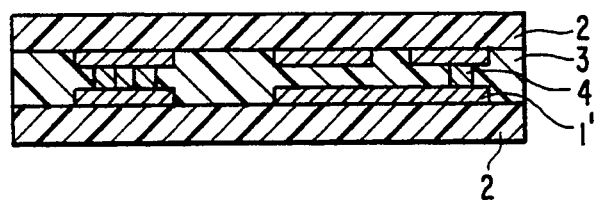
Figure 20C:
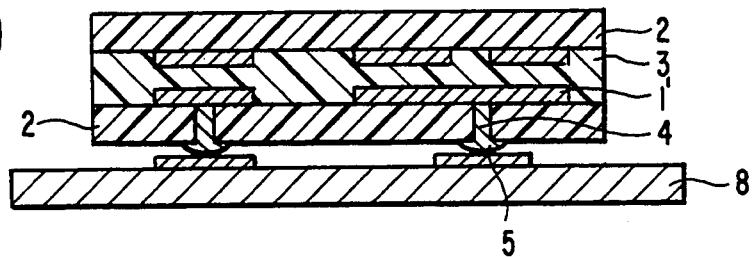
Figure 20D:
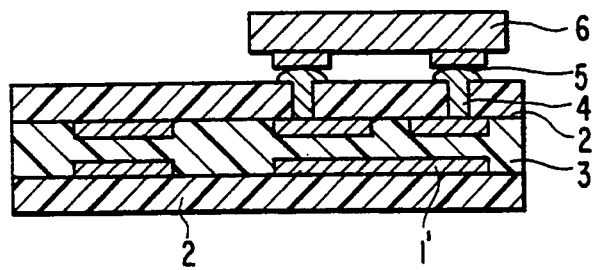

FIG. 20(a) is an enlarged schematic sectional view of a double printed substrate comprising a thermoplastic polyimide resin layer 3 having a wiring circuit 1' embedded therein and a low-linear expansion polyimide resin layer 2 as a cover coat layer. FIG. 20(b) is an enlarged schematic sectional view of a double printed substrate wherein wiring circuits 1' embedded in both sides are electrically connected by conducting paths 4. FIG. 20(c) is an enlarged schematic sectional view showing the state that conducting paths 4 are formed in the low-linear expansion polyimide resin layer 2 to form terminals 5 for connecting external members and the substrate is connected to a land portion of an external substrate 8 using the terminals. FIG. 20(d) is an enlarged schematic sectional view showing the state that conducting paths 4 are formed in the low-linear expansion polyimide resin layer 2 to form terminals 5 for connecting with external members and the substrate is connected to the electrode pads of a semiconductor element 6 using the terminals.

FIG. 21 to FIG. 24 are enlarged schematic sectional views for explaining the methods of obtaining the flexible double printed substrates.

Figure 21:
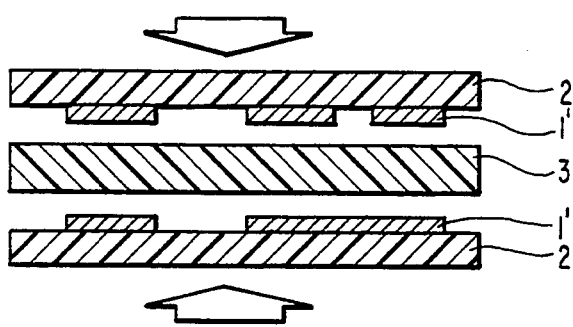
FIG. 21 is an enlarged schematic sectional view showing an example of producing the double printed substrate of the present invention.

FIG. 21 shows the method of obtaining the double printed substrate shown in FIG. 20(a) and the substrate is obtained by disposing each low-linear expansion polyimide resin layer 2 having a wiring circuit 1' on one side thereof on both sides of a thermoplastic polyimide resin layer 3 such that the wiring circuit 1' is embedded in the thermoplastic polyimide resin layer 3, and press-bonding them under heating.

Figure 22:
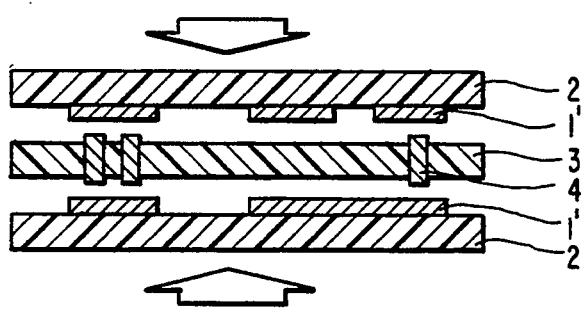
FIG. 22 is an enlarged schematic sectional view showing other example of producing the double printed substrate of the present invention.

FIG. 22 shows the method of obtaining the double printed substrate shown in FIG. 20(b) and the substrate is obtained by previously forming conducting paths 4 in the thickness direction of a thermoplastic polyimide resin layer 3, disposing each low-linear expansion polyimide resin layer 2 having a wiring circuit 1' on one side thereof on both sides of the thermoplastic polyimide resin layer 3 such that the wiring circuits 1' are brought into contact with the conducting paths 4, and press-bonding them under heating.

Figure 23:
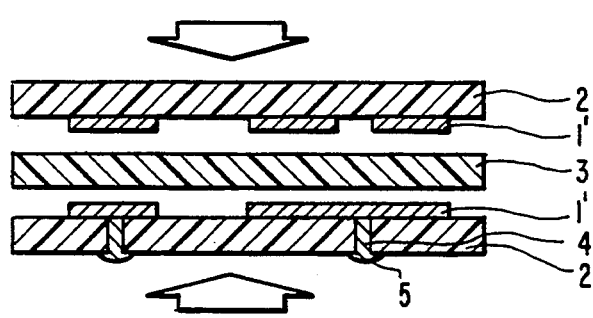
FIG. 23 is an enlarged schematic sectional view showing a further example of producing the double printed substrate of the present invention.

FIG. 23 shows the method of obtaining the double printed substrate shown by FIG. 20(c) and the substrate is obtained by previously forming conducting paths 4 in the wiring circuit 1' formed region of a low-linear expansion polyimide resin layer 2 having the wiring circuit 1', disposing the low-linear expansion polyimide resin layer 2 having the conducting paths 4 and the wiring circuit 1' and a low-linear expansion polyimide resin layer having a wiring circuit 1' only on both sides of a thermoplastic polyimide resin layer 3 such that each wiring circuit 1' is brought into contact with the thermoplastic polyimide resin layer 3, and press-bonding them under heating.

Figure 24:
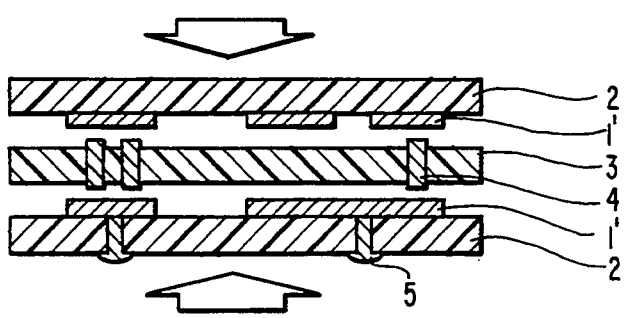
FIG. 24 is an enlarged schematic sectional view showing another example of producing the double printed substrate of the present invention.

FIG. 24 shows a production method of a double printed substrate by forming conducting paths 4 in a thermoplastic polyimide resin layer 3 for conducting wiring circuits 1' at both sides of the thermoplastic polyimide resin layer 3, and further forming conducting paths 5 in a low-linear expansion polyimide resin layer 2 as terminals 5 for connecting with external members, and the substrate can be obtained by forming through-holes in the low-linear expansion polyimide resin layer 2 at the wiring circuit 1' of the flexible double printed substrate obtained by the method shown in FIG. 22 and filling a metallic material in the through-holes by plating.

The flexible printed substrates of the present invention have the first to sixth structures as described above and when the wiring circuit at the back side of such a flexible printed substrate is exposed, a cover lay film is usually laminated on the surface of the wiring circuit for protecting the wiring circuit from moisture and foreign matters in surrounding atmosphere. However, many cover lay films do not have an adhesive property and when such a cover lay film is laminated on the wiring circuit to cover it using an adhesive, there is a problem of lowering the heat resistance of the whole substrate since the heat resistance of the adhesive is generally lower than the heat resistance of polyimide resins.

Thus, in the present invention, a cover lay film comprising a polyimide resin and having a heat resistance and an adhesive property has been discovered. The film comprises a polyimide resin having a repeating unit represented by the following formula and has a heat adhesive property, and is formed on the wiring circuit of the foregoing flexible printed substrate.

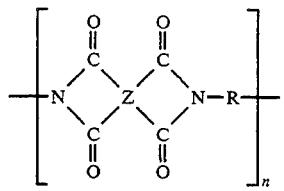

wherein Z is a tetravalent organic group and represents a diphenyl group or a diphenyl ether group; R is a divalent organic group and represents a diphenylsulfone group, a bis(phenoxyphenyl)sulfone group, or a bis(-phenoxy)phenyl group; and n represents an integer of 1 or more, the bonding position of a benzene ring being the meta-position or the para-position.

The film can be press-bonded under heating to a printed substrate under the conditions of a temperature of from 250° to 420° C., and preferably from 280° to 380° C. and a pressure of from 1 to 150 kg/cm$^2$, and preferably from 5 to 100 kg/cm$^2$.

If the film is heated to a temperature over 420° C., it sometimes happens that the temperature reaches the fragile temperature or the decomposition temperature of the film, whereby the press-bonded film becomes brittle or is carbonized, which is undesirable. On the other hand, the pressure is over 250 kg/cm$^2$, it sometimes happens that at press-bonding the film under heating, the wiring circuit on the printed substrate is released from the surface of the insulating resin layer as a base film. In addition, for surely carrying out heat-pressbonding of the film, it is preferable to heat-pressing the film for 1 second or more.

The polyimide resin shown by the above formula can be obtained by polymerizing 3,3',4,4'-biphenyltetracarboxylic acid dianhydride as an acid component and an almost equivalent amount of 3,3'-diaminodiphenylsulfone and/or (3-aminophenoxyphenyl)sulfone as a diamine component in an organic solvent. In the case of polymerizing a mixture of 3,3'-diaminodiphenylsulfone and bis(3-aminophenoxyphenyl)sulfone, the mixing ratio thereof may be optional. In addition, during the polymerization reaction, the polyimide is usually formed through a polyimide percursor unit to provide the polyimide resin.

As described above, the flexible printed substrate of the present invention has a structure comprising an insulating resin layer comprising polyimide resin(s) and a metal layer or a wiring circuit without using the conventional epoxy resin series or maleimide series adhesive, and hence the substrate has excellent characteristics in heat resistance, chemical resistance, dimensional stability, etc. In particular, since the thermoplastic polyimide resin layer having a heat adhesive property is used as an insulating resin layer at the preparation of the double printed substrate and the multilayer substrate, the substrate has an excellent adhesive strength in addition to the above-described excellent characteristics.

Since in the case of using an insulating resin layer having a laminated structure of a low-linear expansion polyimide resin layer and a thermoplastic polyimide resin layer, a mixed region of both the polyimide resins exists in the interface between both layers, these layers are reluctant to separate from each other.

Further, since the metal layers or wiring circuits of the double printed substrate or the multilayer substrate of the present invention are electrically connected not by conventional through-hole plating but by the conducting paths formed by filling a metallic material in through-holes, the electric resistance is low and they are surely conducted.

The present invention is described in more detail by reference to the following examples, but it should be understood that the present invention is not deemed to be limited thereto. In these examples, all the percents, parts, ratios and the like are by weight unless indicated otherwise.

EXAMPLE 1

A low-linear expansion polyimide precursor solution was obtained by polymerizing 3,3',4,4'-biphenyltetracarboxylic acid dianhydride and an almost equimolar amount of p-phenylenediamine in N-methyl-2-pyrrolidone, and the solution was uniformly coated by flowcasting on a rolled copper foil (thickness 35 μm) using a comma coater followed by drying at 100° C.

A thermoplastic polyimide precursor solution obtained by polymerizing bis(3,4-dicarboxyphenyl) ether dianhydride and an almost equimolar amount of bis[4-(4-aminophenoxy)phenyl]sulfone in N-methyl-2-pyrrolidone was coated by flowcasting on the precursor layer obtained above by the same manner as above followed by heating to form a thermoplastic polyimide precursor layer.

The flexible printed substrate thus obtained was heated to 450° C. in a continuous heating furnace wherein the oxygen concentration was reduced below 1.5% by a nitrogen gas displacement to carry out dehydrocyclization, whereby the polyimide precursors in the layers were converted into polyimides to provide the flexible printed substrate of the present invention.

The thickness of the low-linear expansion polyimide resin layer (linear expansion coefficient: $1.0 \times 10^{-5}$ cm/cm/°C.) was 35 μm and the thickness of the thermoplastic polyimide resin layer (glass transition temperature: 275° C., melt viscosity at 400° C.: $4 \times 10^6$ poises) was 15 μm.

When the cross section of the flexible printed substrate thus obtained was observed by a scanning type electron microscope, it could be confirmed that a clear interface did not exist between the low-linear expansion polyimide resin layer and the thermoplastic polyimide resin layer and the resin components were mixed in the interface portion. Peeling off strength of the copper foil of the flexible printed substrate was 1.6 kg/cm, and peeling off occurred at the interface between the copper foil and the polyimide resin layer and did not occur between the polyimide resin layers.

A lead frame was adhered to the flexible printed substrate using a hot press under the conditions of 380° C. and 100 kg/cm². When the assembly was subjected to a peeling off test, peeling off did not occur between the thermoplastic polyimide resin layer and the lead frame and occurred between the copper foil and the low-linear expansion polyimide resin layer, which showed the good adhesive property of the thermoplastic polyimide resin layer.

EXAMPLE 2

By following the same procedure as in Example 1 except that a solution of a polyimide precursor composed of 3,3',4,4'-biphenyltetracarboxylic acid dianhydride and p-phenylenediamine/4,4'-diaminodiphenyl ether (60/40 by molar ratio) was used for forming the low-linear expansion polyimide resin layer and a solution of a polyimide precursor composed of bis(3,4-dicarboxyphenyl) ether dianhydride and bis[4-(3-aminophenoxy)phenyl]sulfone was used for forming the thermoplastic polyimide resin layer, a flexible printed substrate of the present invention was prepared.

The thickness of the low-linear expansion polyimide resin layer (linear expansion coefficient: $1.6 \times 10^{-5}$ cm/cm/°C.) was 25 μm and the thickness of the thermoplastic polyimide resin layer (glass transition temperature: 208° C., melt viscosity at 350° C.: $1 \times 10^6$ poises) was 6 μm.

When the cross section of the flexible printed substrate thus obtained was observed by a scanning electron microscope, it could be confirmed that a clear interface did not exist between the low-linear expansion polyimide resin layer and the thermoplastic polyimide resin layer and the resin components were mixed in the interface. The peeling off strength of the copper foil of the flexible printed substrate was 1.6 kg/cm, and peeling off occurred at the interface with the copper foil but did not occur between the polyimide resin layers.

A lead frame was adhered to the flexible substrate using a hot press under the conditions of 350° C. and 50 kg/cm. When the assembly was subjected to a peeling off test, peeling off did not occur between the thermoplastic polyimide resin layer and the lead frame and occurred between the copper foil and the low-linear expansion polyimide resin layer, which showed the good adhesive property of the thermoplastic polyimide resin layer.

EXAMPLE 3

By following the same procedure as in Example 1 except that a solution of a polyimide precursor composed of 3,3',4,4'-biphenyltetracarboxylic acid dianhydride and p-phenylenediamine was used for forming the low-linear expansion polyimide resin layer and a solution of a polyimide precursor composed of bis(3,4-dicarboxyphenyl) ether dianhydride and bis[4-(4-aminophenoxy)phenyl]hexafluoropropane was used for forming the thermoplastic polyimide resin layer, a flexible printed substrate of the present invention was prepared.

The thickness of the low-linear expansion polyimide resin layer (linear expansion coefficient: $1.0 \times 10^{-5}$ cm/cm/°C.) was 35 μm and the thickness of the thermoplastic polyimide resin layer (glass transition temperature: 239° C., melt viscosity at 350° C.: $5 \times 10^6$ poises) was 15 μm.

When the cross section of the flexible printed substrate thus obtained was observed by a scanning type electron microscope, it could be confirmed that a clear interface did not exist between the low-linear expansion polyimide resin layer and the thermoplastic polyimide resin layer and the resin components were mixed in the interface. The peeling off strength of the copper foil of the flexible printed substrate was 2.5 kg/cm, and peeling off occured at the interface with the copper foil and did not occur between the polyimide resin layers.

A lead frame was adhered to the flexible printed substrate using a hot press under the conditions of 350° C. and 50 kg/cm. When the assembly was subjected to a peeling off test, peeling off did not occur between the thermoplastic polyimide resin layer and the lead frame and occurred between the copper foil and the low-linear expansion polyimide resin layer, which showed the good adhesive property of the thermoplastic polyimide resin layer.

Comparison Example 1

By following the same procedure as in Example 1 except that after converting the low-linear expansion polyimide precursor of the precursor layer into the polyimide, the thermoplastic polyimide precursor in the precursor layer was converted into the polyamide, a flexible printed substrate was prepared.

When the cross section of the flexible printed substrate thus obtained was observed by a scanning type electron microscope, a clear interface was observed between the low-linear expansion polyimide resin layer and the thermoplastic polyimide resin layer and a mixed region of the resin components did not exist. When the flexible printed substrate was subjected to a peeling off test of the copper foil and also peeling off test after adhering a lead frame as in Example 1 was carried out, peeling off occurred at the interface between the low-linear expansion polyimide resin layer and the thermoplastic polyimide resin layer.

Comparison Example 2

By following the same procedure as in Example 1 except that the formation order of the low-linear expansion polyimide resin layer and the thermoplastic polyimide resin layer formed on the copper foil was reversed, a flexible printed substrate was prepared.

In the flexible printed substrate thus obtained, a clear interface was not observed between the polyimide resin layers and a mixed region of the resin components existed in the interface of the layers but the substrate had no adhesive property to a lead frame.

EXAMPLE 4

A low-linear expansion polyimide precursor solution was prepared by polymerizing 3,3',4,4'-biphenyltetracarboxylic acid dianhydride and an almost equimolar amount of p-phenylenediamine in N-methyl-2-pyrrolidone and uniformly coated by flow-casting on a rolled copper foil (thickness 35 μm) using a comma coater and dried at 100° C.

A thermoplastic polyimide precursor solution obtained by polymerizing bis(3,4-dicarboxyphenyl) ether dianhydride and an almost equimolar amount of bis[4-(4-aminophenoxy)phenyl]sulfone in N-methyl-2-pyrrolidone was coated by flowcasting on the above precursor layer by the same manner as above and dried at 100° C. to form a thermoplastic polyimide precursor layer.

The single faced substrate thus obtained was heated to 450° C. in a continuous heating furnace wherein the oxygen concentration was reduced below 1.5% by nitrogen gas displacement to carry out dehydrocyclization, whereby the polyimide precursors were converted into the corresponding polyamides.

The thickness of the low-linear expansion polyimide resin layer formed was 20 μm and the thickness of the thermoplastic polyimide resin layer was 5 μm.

Two such single faced substrates were prepared and they were press-bonded to each other under heating such that the thermoplastic polyimide resin layers faced to each other by a vacuum hot press under the conditions of 350° C. and 199 kg/cm$^2$ to provide a flexible double faced substrate.

When the cross section of the double faced substrate obtained was observed by a scanning type electron microscope, it could be confirmed that the thickness of the low-linear expansion polyimide resin layer was 40 μm, the thickness of the thermoplastic polyimide resin layer was 10 μm, a clear interface did not exist between the low-linear expansion polyimide resin layer and the thermoplastic polyimide resin layer, and the resin components were mixed in the interface portion.

When the copper foils at both sides of the double faced substrate were removed by etching and a thermal mechanical analysis was carried out, the linear expansion coefficient of the insulating resin layer which was a laminate of the polyamide resin layers was $2.0 \times 10^{-5}$ cm/cm/°C., and the linear expansion coefficient of each polyimide resin layer was $1.0 \times 10^{-5}$ cm/cm/°C. for the low-linear expansion polyimide resin layer and $5.8 \times 10^{-5}$ cm/cm/°C. for the thermoplastic polyimide resin layer.

The peeling off strength of the double faced substrate obtained was 1.6 kg/cm, and peeling off occurred at the interface with the copper foil and did not occur between the polyimide resin layers. The linear expansion coefficient of copper was $1.6 \times 10^{-5}$ cm/cm/°C. Further, in a soft solder dipping test for 30 seconds at 400° C., no void formed and there was no problem about the heat resistance.

EXAMPLE 5

A low-linear expansion polyimide precursor solution was obtained by polymerizing pyromellitic acid dianhydride and an almost equimolar amount of p-phenylenediamine/4,4'-diaminodiphenyl ether (50/50 by weight ratio) in N,N-dimethylformamide and was uniformly coated by flow-casting on a rolled copper foil (thickness 18 μm) using a roll coater followed by drying at 120° C.

A thermoplastic polyimide precursor solution obtained by polymerizing bis(3,4-dicarboxyphenyl)hexafluoropropane dianhydride and an almost equimolar amount of bis[4-(4-aminophenoxy)phenyl]sulfone in N-methyl-2-pyrrolidone was coated by flow-casting on the precursor layer by the same manner as above and dried at 120° C. to form a thermoplastic polyimide precursor layer.

The single faced substrate thus obtained was heated to 500° C. in a continuous heating furnace wherein the oxygen concenration was reduced below 1.0% by nitrogen gas replacement to carry out dehydrocyclization, whereby the polyimide precursors in the layers were converted into the corresponding polyimides. The thickness of the low-linear expansion polyimide resin layer was 10 μm and the thickness of the thermoplatic polyimide resin layer was 3 μm.

Two such single faced substrates were prepared and they were press-bonded to each other under heating such that the thermoplastic polyimide resin layers faced to each other by a vacuum hot press under the conditions of 350° C. and 200 kg/cm$^2$ to provide the flexible double printed substrate of the present invention.

When the cross section of the double faced substrate obtained was observed by a scanning type electron microscope, it could be confirmed that the thickness of the low-linear expansion polyimide resin layer was 20 μm, the thickness of the thermoplastic polyimide resin layer was 6 ∞m, a clear interface did not exist between the low-linear expansion polyimide resin layer and the thermoplastic polyimide resin layer, and the resin components were mixed in the interface portion.

When the copper foils on both sides of the double faced substrate were removed by etching and a thermal mechanical analysis was carried out, the linear expansion coefficient of the insulating resin layer which was a laminate of the polyimide resin layers was $2.2 \times 10^{-5}$ cm/cm/°C. and the linear expansion coefficient of each polyimide resin layer was $1.6 \times 10^{-5}$ cm/cm/°C. for the low-linear expansion polyimide resin layer and $5.4 \times 10^{-5}$ cm/cm/°C. for the thermoplastic polyimide resin layer. The peeling off strength of the double faced substrate obtained was 1.5 kg/cm, peeling off occurred at the interface with the copper foil and did not occur between the polyimide resin layers. In a soft solder test for 30 seconds at 400° C., no void formed and there was no problem about the heat resistance.

EXAMPLE 6

A low-expansion polyimide precursor solution was obtained by polymerizing 3,3′,4,4′-biphenyltetracarboxylic acid dianhydride and an almost equimolar amount of p-phenylenediamine in N-methyl-2-pyrolidone and was uniformly coated by flow-casting on a rolled copper foil (thickness 35 μm) using a comma coater followed by drying at 100° C.

A thermoplastic polyimide precursor solution obtained by polymerizing bis(3,4-dicarboxyphenyl) ether dianhydride and an almost equimolar amount of bis[4-(4-aminophenoxy)phenyl]sulfone in N-methyl-2-pyrrolidone was coated by flow-casting on the precursor layer by the same manner as above and dried at 100° C. to form a thermoplastic polyimide precursor layer.

The single faced substrate thus obtained was heated to 450° C. in a continuous heating furnace wherein the oxygen concentration was reduced below 1.5% by nitrogen gas displacement to carry out the dehydrocyclization, whereby the polyimide precursors in the layers were converted into the corresponding polyimides. The thickness of the low-linear expansion polyimide resin layer was 20 μm and the thickness of the thermoplastic polyimide resin layer was 5 μm.

Through-holes having a diameter of 50 μm were formed in the low-linear expansion polyimide resin layer and the thermoplastic polyimide resin layer by applying KrF excimer laser light of 200 mJ/pulse and 248 nm in oscillation wavelength to both layers only to expose the surface of the copper foil as the lower layer.

Electrolytic plating was applied in a nickel plating bath using the copper foil as a cathode to fill nickel in the through-holes and when nickel plating grown to a height of 25 μm from the surface of the thermoplastic polyimide resin layer, electrolytic plating was stopped to provide a 1st single faced substrate.

On the other hand, by following the same procedure as above except that the nickel filling step was not carried out, a 2nd single faced substrate was prepared.

The 1st single faced substrate and the 2nd single faced substrate thus obtained were combined such that the thermoplastic polyimide resin layers faced to each other and after making positioning control such that the through-hole formed portions coincided to each other, they were heat-pressed by a vacuum hot press under the conditions of 350° C. and 100 kg/cm$^2$ to adhere the thermoplastic polyimide resin layers to each other to provide a flexible double printed substrate of the present invention having conducting paths.

When the cross section of the double faced substrate obtained was observed by a scanning type electron microscope, it could be confirmed that the thickness of the low-linear expansion polyimide resin layer was 40 μm, the thickness of the thermoplastic polyimide resin layer was 10 μm, a clear interface did not exist between the low-linear expansion polyimide resin layer and the thermoplastic polyimide resin layer, and the resin components were mixed in the interface portion. The result of inspecting the electrical conduction between the copper foils on both sides of the substrate showed that they were surely conducted.

When the copper foils on both sides of the substrate at the portions having no conducting paths were removed by etching and a thermal mechanical analysis was carried out, the linear expansion coefficient of the insulating resin layer which is the laminate of the polyimide resin layers was $2.0 \times 10^{-5}$ cm/cm/°C. and the linear expansion coefficient of each polyamide resin layer was $1.0 \times 10^{-5}$ cm/cm/°C. for the low-linear expansion polyimide resin layer and $5.8 \times 10^{-5}$ cm/cm/°C. for the thermoplastic polyimide resin layer. The peeling off strength of the double faced substrate obtained was 1.6 kg/cm, peeling off occurred at the interface with the copper foil and did not occur at the interface between the low-linear expansion polyimide resin layer and the thermoplastic polyimide resin layer. The linear expansion coefficient of copper is $1.6 \times 10^{-5}$ cm/cm/°C. In a soft solder dipping test for 30 seconds at 400° C., no void formed and there was no problem about the heat resistance.

EXAMPLE 7

A low-linear expansion polyimide precursor solution was obtained by polymerizing 3,3′,4,4′-biphenyltetracarboxylic acid dianhydride and an almost equimolar amount of p-phenylenediamine/4,4′-diaminophenyl ether (60/40 by molar ratio) in N-methyl-2pyrrolidone and was uniformly coated on a rolled copper foil (thickness 35 μm) using a comma coater followed by drying at 100° C.

A thermoplastic polyimide precursor solution obtained by polymerizing bis(3,4-dicarboxyphenyl)hexafluoropropane dianhydride and an almost equimolar amount of bis[4-(3-aminophenoxy)phenyl]sulfone in N-methyl-2-pyrrolidone was coated by flow-casting on the aforesaid precursor layer by the same manner as above and dried at 100° C. to form a thermoplastic polyimide precursor layer.

The single faced substrate thus obtained was heated to 420° C. in a continuous heating furnace wherein the oxygen concentration was reduced below 1.0% by nitrogen gas displacement, whereby the precursors in the layers were converted into the corresponding polyimides. The thickness of the low-linear expansion polyimide resin layer was 20 μm and the thickness of the thermoplastic polyimide resin layer was 5 μm.

When the cross section of the single faced substrate obtained was observed by a scanning type elecron microscope, it could be confirmed that a clear interface did not exist between the low-linear expansion polyimide resin layer and the thermoplatic polyimide resin layer and the resin components were mixed in the interface portion.

The copper foil on the single faced substrate was removed by etching and a thermal mechanical analysis was carried out. The linear expansion coefficient of the insulting resin layer which was a laminate of the polyimide resin layers was $2.5 \times 10^{-5}$ cm/cm/°C. and the linear expansion coeffiecnt of each polyimide resin layer was $1.7 \times 10^{-5}$ cm/cm/°C. for the low-linear expansion polyimide resin layer and $5.5 \times 10^{-5}$ cm/cm/°C. for the thermoplatic polyimide resin layer.

After forming a copper circuit on the single faced substrate as in Example 1, a plurality of such single faced substrates were laminated such that the thermoplastic polyimide resin layer side of one substrate faced the copper circuit of other substrate by a laminater wherein the oxygen concentration was reduced below 1.5% by nitrogen gas displacement and they were press-bonded to each other by heating under the conditions of 370° C. and 50 kg/cm$^2$ to provide a multilayer flexible printed substrate (5 layer structure).

The peeling off strength of the multilayer substrate thus obtained was 3.4 kg/cm and peeling off occurred at the interface with the copper foil and did not occur between the polyimide resin layers. In a soft solder dipping test for 30 seconds at 400° C., no void formed and there was no problem about the heat resistance.

EXAMPLE 8

A polyimide precursor solution was prepared using bis(3,4-dicarboxyphenyl)hexafluoropropane dianhydride and bis[4-(4-aminophenoxy)phneyl]hexafluoropropane by the same manner as in Example 1, was coated on a rolled copper foil followed by drying, and heated to convert the polyimide precursor into the polyimide to form a thermoplastic polyimide resin layer of 50 μm in thickness.

Through-holes having a diameter of 50 μm were formed in the thermoplastic polyimide resin layer by applying XeCl excimer laser light of 200 mJ/pulse and 308 nm in oscillation wavelength to the thermoplastic polyimide resin layer only, nickel was filled in the through-holes as in Example 6, and when nickel plating grown to a height of 1 μm from the surface of the thermoplastic polyimide resin layer, electrolytic plating was stopped to provide a single faced substrate.

A copper foil (thickness 18 μm) was press-bonded by heating to other side of the thermoplastic polyimide resin layer of the single faced substrate thus obtained by a vacuum hot press under the conditions of 400° C. and 20 kg/cm$^2$ to provide a double faced substrate of the present invention by the 1st production method.

The result of inspecting the electric conduction between the copper foils at both sides of the double faced substrate showed that they were surely conducted.

When the double faced substrate was subjected to a peeling off test, peeling off occurred at the interface of the copper foil and the thermoplastic polyimide resin layer. In a soft solder dipping test for 30 seconds at 400° C., no void formed and there was no problem about the heat resistance. Furthermore, when a portion of the double faced substrate having no conducting paths was cut and the dielectric constant thereof in 1 kHz was measured, it showed a relatively low dielectric constant of 2.5.

EXAMPLE 9

As a low-linear expansion polyimide resin, a polymerized product (linear expansion coefficient: $1.0 \times 10^{-5}$ cm/cm/°C.) of 3,3',4,4'-biphenyltetracarboxylic acid dianhydride and p-phenylenediamine was used and as a thermoplastic polyimide resin, a polymerization product (glass transition temperature: 250° C., melt viscosity at 350° C.: $4 \times 10^6$ poises) of bis(3,4-dicarboxyphenyl) ether dianhydride and bis[4-(4-aminophenoxy)phenyl]sulfone was used. The thermoplatic polyimide resin layer (10 μm thickness), the low-linear expansion polyimide resin layer (30 μm thickness), and the thermoplastic polyimide resin layer (10 μm) were successively laminated on a copper foil having a thickness of 35 μm to provide a single faced substrate having an insulating film of a 3 layer structure.

By dry etching the insulating film only by applying KrF excimer laser light to the surface of the insulating film of the substrate obtained, 20 fine through-holes having a diameter of 60 μm were formed with a pitch of 200 μm.

A plating resist was coated on the surface of the copper foil at the other side of the substrate, the surface of the copper foil exposed to the bottom of each through-hole was abraded in a hemispherical form with a chemical abrasive solution, and then gold plating was applied in a gold plating bath using the copper foil as a cathode to fill gold in the through-holes previously formed, whereby conducting paths were prepared. When plated gold projected by 5 μm from the surface of the insulating film, plating was stopped to form gold projections at the conducting paths. The diameter of the gold projection formed was 68 μm.

A copper foil of 18 μm thick was press-bonded by heating to the surface of the insulating film at the side of forming the gold projections to provide a double faced substrate of the present invention.

The peeling off strength at the interface between the copper foil and the insulating film in the double faced substrate obtained was 1.4 kg/cm. All 20 conducting paths formed in the double faced substrate electrically conducted the copper foils at both sides thereof and the connecting resistance of one conducting path was 0.1 mΩ or less.

EXAMPLE 10

A polyimide precursor solution was coated on a copper foil (thickness 18 μm) as a metal layer by a spin coating method followed by drying and heated to convert the polyimide precursor into the polyimide to form a polyimide resin film (thickness 12.5 μm) having a copper foil.

A laser light of 248 nm in oscillation wavelength was applied to the surface of the polyimide resin film through a mask of a desired circuit pattern for etching the resin film to form a circuit pattern in the film. The circuit pattern was formed in a wiring circuit width of 15 μm and a wiring circuit interval of 15 μm.

Nickel plating was applied using the polyimide resin film as the plating resist with the copper foil exposed to the bottom of the circuit pattern exposed by the laser etching as a cathode to fill semi-gloss electrolytic nickel in the circuit pattern formed. The thickness of the nickel layer filled was 12.5 μm which was the same thickness of the polyimide resin film as in the insulating resin layer.

A thermoplastic polyimide resin film (thickness: 12.5 μm, glass transition temperature: 205° C., melt viscosity at 390° C.: $8 \times 10^3$ poises) was laminated thereon by press-bonding under heating. Since the thermoplastic polyimide resin was used for covering, the resin could be in a body with the polyimide resin film by heating.

The copper foil as a metal layer was selectively removed using an alkali etchant (selective copper dissolving solution) to provide a desired flexible printed substrate.

Since in the flexible printed substrate obtained as described above, the wiring circuit is embedded in the insulating resin layer, the thickness of the flexible printed substrate depends upon the thickness only of the insulating resin layer, whereby the substrate can be easily thinned. Also, since the pattern of the wiring circuit depends upon the resolving power only of the laser processing apparatus, the resolving power is not lowered by cleaning with a chemical solution in a conventional photoetching step and a fined wiring circuit can be obtained with a high processing precision.

EXAMPLE 11

In a mixture of 248.5 g (1 mol) of 3,3'-diaminodiphenylsulfone and 1,266 g of N-methyl-2-pyrrolidone was gradually added 294.2 g (1 mol) of 3,3',4,4'-biphenyltetracarboxylic acid dianhydride and the polymerization was carried out for 12 hours at normal temperature to provide a polyimide precursor solution.

The polyimide precursor solution obtained was casted on a glass plate and heated successively to 100° C., 150° C., 250° C., and 300° C. each for 1 hour in a hot blast circulating dryer to heat while raising the temperature, whereby the precursor was converted into the polyimide to form a heat-adhesive polyimide film of 30 μm in thickness.

The heat-adhesive film was placed on the surface of a wiring circuit of a copper/polyimide film (two layer substrate) having a pattern of line and space of 300 μm and press-bonded by heating using a hot press. The pressing condition is shown in Table 1 below.

The adhesion state after press-bonding and the state (soft solder resistance) in the case of immersing the substrate after adhering in a soft solder bath for 1 minute at 360° C. are shown in Table 1.

EXAMPLE 12

In a mixture of 432.5 g (1 mol) of bis[4-(3-aminophenoxyphenyl)]sulfone and 2,180 g of N,N-dimethylacetamide was gradually added 294.2 g (1 mol) of 3,3',4,4'-biphenyltetracarboxylic acid dianhydride and the polymerization was carried out for 12 hours at normal temperature to provide a polyimide precursor solution. The polyimide precursor solution obtained was casted on a glass plate and successively heated to 100° C., 150° C., 250° C., and then 300° C. each for 1 hour in a hot blast circulating dryer to heat while raising the temperature, whereby the precursor was converted into the polyimide to form a heat-adhesive polyimide film of 35 μm in thickness.

The heat-adhesive film was adhered by heating under the condition shown in Table 1 as in Example 11, the adhesion state and the soft solder resistance were determined, and the results are shown in Table 1.

EXAMPLE 13

In a mixture of 124.3 g (0.5 mol) of 3,3'-diaminodiphenylsulfone, 215.2 g (0.5 mol) of bis[4-(3-aminophenoxyphenyl)]sulfone, and 1,904 g of N-methyl-2-pyrrolidone was gradually added 294.2 g (1 mol) of 3,3',4,4'-biphenyltetracarboxylic acid dianhydride and the polymerization was carried out for 12 hours at normal temperature to provide a polyamide acid solution.

To the polyamide acid solution obtained was applied the same operation as in Example 11 to provide a heat-adhesive polyimide film of 35 μm in thickness. The heat-adhesive film was heat-adhered under the condition shown in Table 1 as in Example 11, the adhesion state and the soft solder resistance were determined, and the results are shown in Table 1.

TABLE 1

| Example | Heating Temperature (°C.) | Pressing Pressure (kg/cm$^2$) | Pressing Time (min) | Adhesive State | State after Immersing Soft Solder |
|---|---|---|---|---|---|
| 11 | 380 | 45 | 10 | Good | Good |
| 12 | 250 | 250 | 15 | Good | Good |
| 13 | 350 | 65 | 10 | Good | Good |

While the invention has been described in detail and with reference to specific examples thereof, it will be apparent to one skilled in the art that various changes and modifications can be made therein without departing from the spirit and scope thereof.

What is claimed is:

1. A flexible printed substrate comprising an insulating resin layer comprising a low-linear expansion polyimide resin layer and a thermoplastic polyimide resin layer, and a metal layer or a wiring circuit formed on the low-linear expansion polyimide resin layer of the insulating resin layer, wherein a mixed region comprising low-linear expansion polyimide resin and thermoplastic polyimide resin components is formed in the interface between the low-linear expansion polyimide resin layer and the thermoplastic polyimide resin layer.

2. The flexible printed substrate of claim 1, wherein the substrate is obtained by a step of coating a low-linear expansion polyimide precursor solution on a metal layer followed by drying, a step of coating a thermoplastic polyimide precursor solution on the coated layer followed by drying, and a step of heating the precursor layers to convert the precursors into the polyimides.

3. The flexible printed substrate of claim 2, wherein the substrate is obtained by additionally including a step of patterning the metal layer to form a wiring circuit.

4. The flexible printed substrate of claim 1, wherein a heat-adhesive film comprising a polyimide resin having a repeating unit represented by the following formula is formed on the surface of the wiring circuit of the flexible printed substrate:

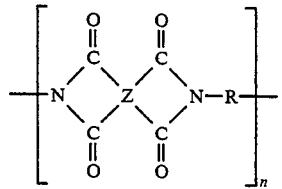

wherein Z represents a tetravalent organic group; R represents a divalent organic group; and n represents an integer of 1 or more, the bonding position of the benzene ring being the meta-position or the para-position.

5. The flexible printed substrate of claim 4, wherein the tetravalent organic group is a diphenyl group or a diphenyl ether group.

6. The flexible printed substrate of claim 4, wherein the divalent organic group is a diphenylsulfone group, a bis(phenoxyphenyl)sulfone group or a bis(phenoxy)phenyl group.

7. A flexible double printed substrate comprising an insulating resin layer comprising low-linear expansion polyimide resin layer/thermoplastic polyimide resin layer/low-linear expansion polyimide resin layer, and a metal layer or a wiring circuit formed on each low-linear expansion polyimide resin layer, wherein a mixed region comprising low-linear expansion polyimide resin and thermoplastic polyimide resin components is formed in the interface between the low-linear expansion polyimide resin layer and the thermoplastic polyimide resin layer.

8. The flexible double printed substrate of claim 7, wherein when the linear expansion coefficient of the thermoplastic resin layer is $a_1$, the thickness of the thermoplastic polyimide resin layer is $t_1$, the linear expansion coefficient of the low-linear expansion polyimide resin layer is $a_2$, and total thickness of the two low-linear expansion polyimide resin layers is $t_2$, the difference between the value of $a_1 \cdot [t_1/(t_1+t_2)] + a_2 \cdot [t_2/(t_1+t_2)]$ and the linear expansion coefficient of the wiring circuit is $1.0 \times 10^{-5}$ cm/cm/°C. or less.

9. The flexible double printed substrate of claim 7, wherein the linear expansion coefficient of the thermoplastic polyimide resin layer is $4.0 \times 10^{-5}$ cm/cm/°C. or less and the linear expansion coefficient of the total insulating resin layers is controlled to $2.6 \times 10^{-5}$ cm/cm/°C. or less.

10. The flexible double printed substrate of claim 7, wherein the substrate is obtained by a step of coating a low-linear expansion precursor solution on a metal layer followed by drying, a step of coating a thermoplastic polyimide precursor solution of the coated layer followed by drying, a step of heating them to a temperature of at least 400° C. in an inert gas atmosphere, whereby the precursors of the layers are converted into the polyimides to provide a single faced substrate, and a step of bonding the thermoplastic polyimide resin layers of two such single faced substrates to each other.

11. The flexible double printed substrate of claim 7, wherein the substrate is obtained by additionally including, before bonding step, a step of patterning the metal layer to form a wiring circuit.

12. The flexible double printed substrate of claim 7, wherein the metal layers or wiring circuits formed on both sides of the substrate are electrically connected by conductive ways formed by filling a metallic material in through-holes formed in the thickness direction of the insulating resin layer.

13. The flexible double printed substrate of claim 12, wherein a bump-form metal projection is formed at at least one end of each conducting path, said metal projection contacting with the metal layer or the wiring circuit in an embedded state therein.

14. The flexible double printed substrate of claim 12, wherein the substrate is obtained by step (a) of coating a low-linear expansion polyimide percursor solution on a metal layer followed by drying, step (b) of coating a thermoplastic polyimide precursor solution on the coated layer followed by drying, step (c) of heating them to a temperature of at least 400° C. in an inert gas atmosphere, whereby the precursors are converted into the polyimides to provide a single faced substrate, step (d) of forming through-holes at definite positions of the insulating resin layer comprising the low-linear expansion polyimide resin layer and the thermoplastic polyimide resin layer to expose the metal layer or the wiring circuit at the bottom portion of each through-hole, step (e) of filling a metallic material in the through-holes and further projecting the metallic material in a bump form from the surface of the thermoplastic resin layer to form a 1st single faced substrate, on the other hand, forming a 2nd single faced substrate by the steps (a), (b), (c), and (d), and press-bonding the 1st single faced subsrtate and the 2nd single faced substrate such that the thermoplastic polyimide resin layers face to each other with positioning control such that the through-hole portions of the 1st single faced substrate coincide with the through-hole portions of the 2nd single faced sunstrate.

15. The flexible double printed substrate of claim 14, wherein the substrate is obtained by additionally including, before step (d), a step of patterning the metal layer to form a wiring circuit.

16. The flexible double printed substrate of claim 7, wherein a heat-adhesive film comprising a polyimide resin having a repeating unit represented by the following formula is formed on the surface of the wiring circuit:

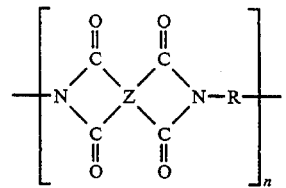

wherein Z represents a tetravalent organic group; R represents a divalent organic group; and n repesents an integer of 1 or more, the bonding position of the benzene ring being the meta-position or the para-position.

17. The flexible double printed substrate of claim 16, wherein the tetravalent organic group is a diphenyl group or a diphenyl ether group.

18. The flexible double printed substrate of claim 16, wherein the divalent organic group is a diphenylsulfone group, a bis(phenoxyphenyl)sulfone group, or a bis(phenoxy)phenyl group.

19. A multilayer printed substrate formed by laminating a plurality of the flexible printed substrate as claimed in claim 1.

20. The multilayer flexible printed substrate of claim 19, wherein at least one through-hole is formed in the insulating resin layer comprising the low-linear expansion polyimide resin layer and the thermoplastic polyimide resin layer in the region of forming a wiring circuit or near the region in the thickness direction thereof, conducting paths filled with a metallic material and bump-form metal projections are formed in the through-holes formed in the region of forming the wiring circuit, and the wiring circuits are electrically connected through the bump-form metal projections.

21. The multilayer flexible printed substrate of claim 19, wherein a bump-form metal projection is formed at least one end of each conducting path, said projection being connected to the metal layer or the wiring circuit in an embedded state.

22. The multilayer flexible printed substrate of claim 19, wherein the substrate is obtained by a step of coating a low-linear expansion polyimide precursor solution on a metal layer followed by drying, a step of coating a thermoplastic polyimide precursor on the coated layer followed by drying, a step of heating them to a temperature of at least 400° C. in an inert gas atmosphere, whereby the precursors are converted into the polyimides, a step of patterning the metal layer to form a wiring circuit, and a step of press-bonding by heating a plurality of the flexible printed substrate such that the thermoplastic polyimide resin layer of one substrate faces the wiring circuit formed on other substrate.

23. The multilayer flexible printed substrate of claim 19, wherein a heat-adhesive film comprising a polyimide resin having a repeating unit represented by the following formula:

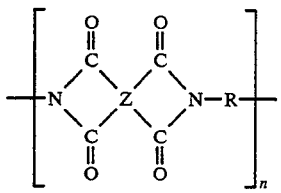

wherein Z represents a tetravalent organic group; R represents a divalent organic group; and n represents an integer of 1 or more, the bonding position of the benzene ring being the meta-position or the para-position.

24. The multilayer flexible printed substrate of claim 23, wherein the tetravalent organic group is a diphenyl group or a diphenyl ether group.

25. The multilayer flexible printed substrate of claim 23, wherein the divalent organic group is a diphenylsulfone group, a bis(phenoxyphenyl)sulfone group, or a bis(phenoxy)phenyl group.

26. A flexible double printed substrate comprising an insulating resin layer comprising a thermoplastic polyimide resin layer and a metal layer or a wiring circuit formed on both sides of the insulating resin layer, wherein the metal layers or the wiring circuits formed on both sides of the insulating layer are electrically connected by conducting paths formed by filling a metallic material in through-holes formed in the thickness direction of the thermoplastic polyimide resin layer.

27. The flexible double printed substrate of claim 26, wherein the substrate is obtained by forming through-holes in the thermoplastic polyimide resin layer only of a single faced substrate comprising the thermoplastic polyimide resin layer and a metal layer or a wiring circuit formed on one surface of the layer, filling a metallic material in the through-holes and projecting the metallic material in a bump form from the surface of the thermoplastic polyimide resin layer, and press-bonding a metal layer to the projected side of the metallic material.

28. The flexible double printed substrate of claim 27, wherein a bump-form metal projection is formed at least one end of each conducting path, said metal projection contacting with the metal layer or the wiring circuit in an embedded state therein.

29. The flexible double printed subsrtate of claim 26, wherein the substrate is obtained by forming through-holes in the thermoplastic polyimide resin layer only of a single faced substrate comprising the the thermoplastic polyimide resin layer and a metal layer or a wiring circuit formed on one surface of the layer, filling a metallic material in the through-holes to form conducting paths and projecting the metallic material filled in the through-holes in a bump form from the surface of the thermoplastic resin layer, combining the single faced substrate having the metal projections thus formed with other single faced substrate having through-holes without being filled with a metallic material with positioning control such that the projections of the metallic material face the empty through-holes of other substrate, and press-bonding them.

30. The flexible double printed substrate of claim 26, wherein the substrate is obtained by forming through-holes in the thermoplastic polyimide resin layer only of a single faced substrate comprising the thermoplastic polyimide resin layer and a metal layer or a wiring circuit formed on one surface of the layer, filling a metallic material in the through-holes to form conducting paths and projecting the metallic material filled in the through-holes in a bump form from the surface of the thermoplastic polyimide resin layer, preparing two such single faced substrates, combining both the substrates with positioning control such that the projections of a metallic material of one substrate face the projections of a metallic material of another substrate, and press-bonding them.

31. The flexible double printed substrate of claim 26, wherein a heat-adhesive film comprising a polyimide resin having a repeating unit represented by the following formula is formed on the surface of each wiring circuit:

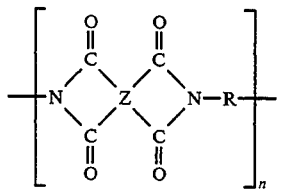

wherein Z represents a tetravalent organic group; R represents a divalent organic group; and n represents an integer of 1 or more, the bonding position of the benzene ring being the meta-position or the para-position.

32. The flexible double printed substrate of claim 31, wherein the tetravalent organic group is a diphenyl group or a diphenyl ether group.

33. The flexible double printed substrate of claim 31, wherein the divalent organic group is a diphenylsulfone group, a bis(phenoxyphenyl)sulfone group, or a bis(phenoxy)phenyl group.

34. A flexible printed substrate comprising an insulating resin layer and a wiring circuit, wherein said wiring circuit is embedded in the insulating resin layer.

35. The flexible printed substrate of claim 34, wherein a metal projection is formed on the wiring circuit for connecting with other wiring circuit or a semiconductor element.

36. The flexible printed substrate of claim 34, wherein the substrate is obtained by a step of forming a pattern of a wiring circuit on a metal layer using a photoresist and forming a wiring circuit by electrolytic plating or electroless plating, a step of removing the photoresist and coating the surface of the exposed wiring circuit with an insulating resin layer, and a step of removing the metal layer.

37. The flexible printed substrate of claim 36, which further includes a step of forming a pattern of a wiring circuit using a photoresist and then chemically etching or electrolytically corroding the surface of the metal layer exposed to the bottom portion of the pattern to form concaved portions.

38. The flexible printed substrate of claim 36, wherein a metal layer or a wiring circuit is formed on the back surface of the insulating resin layer covering the wiring circuit.

39. The flexible printed substate of claim 34, wherein the substrate is obtained by a step of etching the insulating resin layer of a substate comprising a metal layer and the insulating resin layer in a desired wiring circuit pattern form, a step of filling a metallic material in the wiring circuit pattern formed by etching by applying plating, a step of laminating an insulating resin layer on the filled pattern, and a step of removing the metal layer.

40. The flexible printed substrate of claim 39, wherein the etching step is carried out using a laser etching method.

41. The flexible printed substrate of claim 39, wherein at least one of the insulating resin layer is a thermoplastic polyimide resin layer.

42. The flexible printed substrate of claim 39, wherein metal projections are formed on the wiring circuit.

43. A flexible double printed substrate comprising a thermoplastic resin layer having wiring circuits each embedded in both sides of the layer and low-linear expansion polyimide resin layers each formed on both surfaces of the thermoplastic resin layer.

44. The flexible double printed substrate of claim 43, wherein the wiring circuits at both sides of the thermoplastic polyimide resin layer are electrically connected by conducting paths filled with a metallic material formed in the thickness direction of the layer.

45. The flexible double printed substrate of claim 44, wherein terminals for connecting an external members are formed by the conducting paths formed in the thickness direction of the low-linear expansion polyimide resin layer.

46. The flexible double printed substrate of claim 44, wherein a single faced substrate having a wiring circuit formed on one surface of the low-linear expansion polyimide resin layer is laminated on both surface of the thermoplastic resin layer such that the wiring circuits contact with each other to embed each wiring circuit in the surface portions of both sides of the thermoplastic polyimide resin layer.

* * * * *